United States Patent
Siemieniec et al.

(10) Patent No.: US 11,626,477 B2
(45) Date of Patent: *Apr. 11, 2023

(54) SILICON CARBIDE FIELD-EFFECT TRANSISTOR INCLUDING SHIELDING AREAS

(71) Applicant: Infineon Technologies AG, Neubiberg (DE)

(72) Inventors: Ralf Siemieniec, Villach (AT); Thomas Aichinger, Faak am See (AT); Thomas Basler, Chemnitz (DE); Wolfgang Bergner, Klagenfurt (AT); Rudolf Elpelt, Erlangen (DE); Romain Esteve, Villach (AT); Michael Hell, Erlangen (DE); Daniel Kueck, Villach (AT); Caspar Leendertz, Munich (DE); Dethard Peters, Hoechstadt (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/375,034

(22) Filed: Jul. 14, 2021

(65) Prior Publication Data
US 2021/0343835 A1 Nov. 4, 2021

Related U.S. Application Data

(62) Division of application No. 16/404,284, filed on May 6, 2019, now Pat. No. 11,101,343.

(30) Foreign Application Priority Data

May 7, 2018 (DE) .......................... 102018110943.1

(51) Int. Cl.
*H01L 29/06* (2006.01)
*H01L 29/78* (2006.01)
(Continued)

(52) U.S. Cl.
CPC ...... *H01L 29/0607* (2013.01); *H01L 21/0465* (2013.01); *H01L 29/1095* (2013.01);
(Continued)

(58) Field of Classification Search
CPC ............ H01L 29/0607; H01L 29/1095; H01L 29/1608; H01L 29/66068; H01L 29/7806; H01L 29/7813
(Continued)

(56) References Cited

U.S. PATENT DOCUMENTS 4,823,172 A 4/1989 Mihara
6,008,520 A 12/1999 Darwish et al.
(Continued)

FOREIGN PATENT DOCUMENTS

DE 102004029297 A1 11/2005
DE 102005041358 A1 3/2007
(Continued)

OTHER PUBLICATIONS

Hsu, Fu-Jen, et al., "High Efficiency High Reliability SiC MOSFET with Monolithically Integrated Schottky Rectifier", Proceedings of The 29th International Symposium on Power Semiconductor Devices & ICs, Sapporo, Japan, May 28-Jun. 1, 2017, pp. 45-48.
(Continued)

*Primary Examiner* — Matthew E. Gordon
(74) *Attorney, Agent, or Firm* — Murphy, Bilak & Homiller, PLLC

(57) ABSTRACT

A semiconductor component includes: gate structures extending from a first surface into an SiC semiconductor body; a drift zone of a first conductivity type formed in the
(Continued)

SiC semiconductor body; first mesas and second mesas arranged between the gate structures in the SiC semiconductor body; body areas of a second conductivity type arranged in the first mesas and the second mesas, the body areas each adjoining a first side wall of one of the gate structures; first shielding areas of the second conductivity type adjoining a second side wall of one of the gate structures; second shielding areas of the second conductivity type adjoining the body areas in the second mesas; and diode areas of the conductivity type of the drift zone, the diode areas forming Schottky contacts with a load electrode between the first shielding areas and the second shielding areas.

23 Claims, 14 Drawing Sheets

(51) Int. Cl.
  H01L 29/16 (2006.01)
  H01L 21/04 (2006.01)
  H01L 29/66 (2006.01)
  H01L 29/10 (2006.01)
(52) U.S. Cl.
  CPC .... *H01L 29/1608* (2013.01); *H01L 29/66068* (2013.01); *H01L 29/7806* (2013.01); *H01L 29/7813* (2013.01)
(58) Field of Classification Search
  USPC .......................................................... 257/77
  See application file for complete search history.

(56) References Cited

U.S. PATENT DOCUMENTS

| | | | |
|---|---|---|---|
| 7,582,922 B2 | 9/2009 | Werner | |
| 7,700,971 B2 | 4/2010 | Ueno | |
| 7,872,308 B2 | 1/2011 | Akiyama et al. | |
| 7,989,882 B2 | 8/2011 | Zhang et al. | |
| 8,252,645 B2 | 8/2012 | Hshieh | |
| 8,431,470 B2 | 4/2013 | Lui et al. | |
| 8,525,254 B2 | 9/2013 | Treu et al. | |
| 8,637,922 B1 | 1/2014 | Siemieniec et al. | |
| 8,653,589 B2 | 2/2014 | Hsieh | |
| 9,093,522 B1 | 7/2015 | Zeng et al. | |
| 9,136,372 B2 | 9/2015 | Miyahara et al. | |
| 9,293,558 B2 | 3/2016 | Siemieniec et al. | |
| 9,478,655 B2 | 10/2016 | Siemieniec et al. | |
| 9,496,384 B2 | 11/2016 | Nakano | |
| 9,577,073 B2 | 2/2017 | Esteve et al. | |
| 9,837,527 B2 | 12/2017 | Siemieniec et al. | |
| 9,929,265 B1 | 3/2018 | Kondo et al. | |
| 10,211,306 B2 | 2/2019 | Siemieniec et al. | |
| 10,304,953 B2 | 5/2019 | Aichinger et al. | |
| 10,586,845 B1 | 3/2020 | Aichinger et al. | |
| 10,700,192 B2 | 6/2020 | Siemieniec et al. | |
| 10,714,609 B2 | 7/2020 | Aichinger et al. | |
| 2003/0020134 A1 | 1/2003 | Werner et al. | |
| 2006/0076617 A1 | 4/2006 | Shenoy et al. | |
| 2006/0246650 A1 | 11/2006 | Williams et al. | |
| 2006/0267085 A1 | 11/2006 | Matsuura | |
| 2008/0121989 A1 | 5/2008 | Kocon et al. | |
| 2008/0315250 A1 | 12/2008 | Onozawa | |
| 2009/0146209 A1 | 6/2009 | Akiyama et al. | |
| 2010/0308401 A1 | 12/2010 | Narazaki | |
| 2011/0284954 A1* | 11/2011 | Hsieh | H01L 29/1095 257/331 |
| 2012/0248530 A1 | 10/2012 | Lui et al. | |
| 2012/0319132 A1 | 12/2012 | Bhalla et al. | |
| 2013/0168701 A1 | 7/2013 | Kiyosawa et al. | |
| 2013/0200451 A1 | 8/2013 | Yilmaz et al. | |
| 2013/0313635 A1 | 11/2013 | Nakano | |
| 2013/0341711 A1 | 12/2013 | Matsumoto et al. | |
| 2014/0021484 A1 | 1/2014 | Siemieniec et al. | |
| 2014/0145206 A1 | 5/2014 | Siemieniec et al. | |
| 2014/0145258 A1 | 5/2014 | Lin | |
| 2014/0159053 A1 | 6/2014 | Chen et al. | |
| 2014/0167151 A1 | 6/2014 | Yen et al. | |
| 2014/0210000 A1 | 7/2014 | Tokuda et al. | |
| 2014/0210001 A1 | 7/2014 | Yamazaki | |
| 2016/0163852 A1 | 6/2016 | Siemieniec et al. | |
| 2016/0260829 A1 | 9/2016 | Aichinger et al. | |
| 2017/0236931 A1 | 8/2017 | Meiser et al. | |
| 2017/0345905 A1 | 11/2017 | Siemieniec et al. | |
| 2018/0122933 A1 | 5/2018 | Matocha et al. | |
| 2018/0277637 A1 | 9/2018 | Meiser et al. | |
| 2018/0358449 A1 | 12/2018 | Zeng et al. | |
| 2019/0067462 A1 | 2/2019 | Tamura et al. | |
| 2019/0081170 A1* | 3/2019 | Kumagai | H01L 21/8213 |
| 2019/0109227 A1 | 4/2019 | Kobayashi et al. | |
| 2019/0245075 A1 | 8/2019 | Aichinger et al. | |
| 2019/0259842 A1 | 8/2019 | Basler et al. | |
| 2019/0326388 A1* | 10/2019 | Arai | H01L 29/407 |
| 2019/0341447 A1 | 11/2019 | Siemieniec et al. | |
| 2020/0161433 A1 | 5/2020 | Leendertz et al. | |
| 2020/0161437 A1 | 5/2020 | Meiser et al. | |

FOREIGN PATENT DOCUMENTS

| | | |
|---|---|---|
| DE | 102012211221 A1 | 1/2013 |
| DE | 102013214196 A1 | 1/2014 |
| DE | 102014113130 A1 | 3/2015 |
| DE | 102014117780 A1 | 6/2016 |
| DE | 102017108738 A1 | 10/2018 |
| DE | 102017128633 A1 | 6/2019 |
| DE | 102018103973 A1 | 8/2019 |
| DE | 102018124737 A1 | 4/2020 |
| DE | 102018124740 A1 | 4/2020 |
| JP | H06104484 A | 4/1994 |
| JP | 07240409 A | 9/1995 |
| JP | 09260650 A | 10/1997 |
| JP | H11154748 A | 6/1999 |
| JP | 2000031484 A | 1/2000 |
| JP | 2000277734 A | 10/2000 |
| JP | 2007080971 A | 3/2007 |
| JP | 2007129259 A | 5/2007 |
| JP | 2007221012 A | 8/2007 |
| JP | 2008505480 A | 2/2008 |
| JP | 2008108824 A | 5/2008 |
| JP | 2008159916 A | 7/2008 |
| JP | 2009117593 A | 5/2009 |
| JP | 2009117649 A | 5/2009 |
| JP | 2009187966 A | 8/2009 |
| JP | 2010541288 A | 12/2010 |
| JP | 2011049267 A | 3/2011 |
| JP | 2012044167 A | 3/2012 |
| JP | 2012151470 A | 8/2012 |
| JP | 2013214661 A | 10/2013 |
| JP | 2014003191 A | 1/2014 |
| JP | 2014075582 A | 4/2014 |
| JP | 2014107571 A | 6/2014 |
| JP | 2014165348 A | 9/2014 |
| JP | 2015226060 A | 12/2015 |
| WO | 03010812 A1 | 2/2003 |
| WO | 03019623 A2 | 3/2003 |
| WO | 2011151901 A1 | 12/2011 |

OTHER PUBLICATIONS

Jiang, Huaping, et al., "SiC MOSFET with Built-in SBD for Reduction of Reverse Recovery Charge and Switching Loss in 10-kV Applications", Proceedings of The 29th International Symposium on Power Semiconductor Devices & ICs, Sapporo, Japan, May 28-Jun. 1, 2017, pp. 49-52.

Kawahara, Koutarou, et al., "6.5 kV Schottky-Barrier-Diode-Embedded SiC-MOSFET for Compact Full-Unipolar Module", Proceedings of The 29th International Symposium on Power Semiconductor Devices & ICs, Sapporo, Japan, May 28-Jun. 1, 2017, pp. 41-44.

(56) References Cited

OTHER PUBLICATIONS

Unknown, Author, "CMF20120D-Silicon Carbide Power MOSFET 1200V 80 mΩ: Z-Fet MOSFET N-Channel Enhancement Mode", CMF20120D Rev. A, Cree, Inc., 2012, 1-13.

* cited by examiner

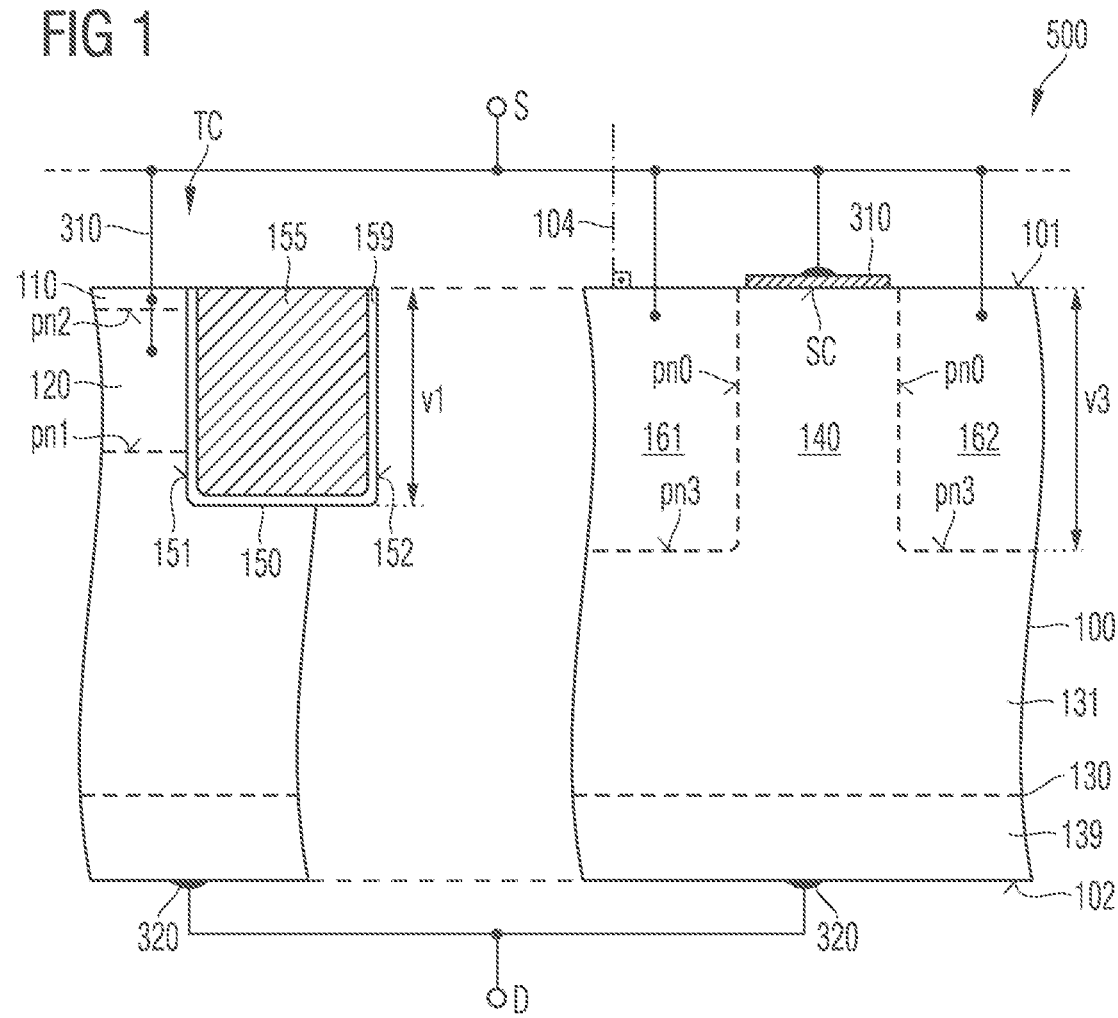

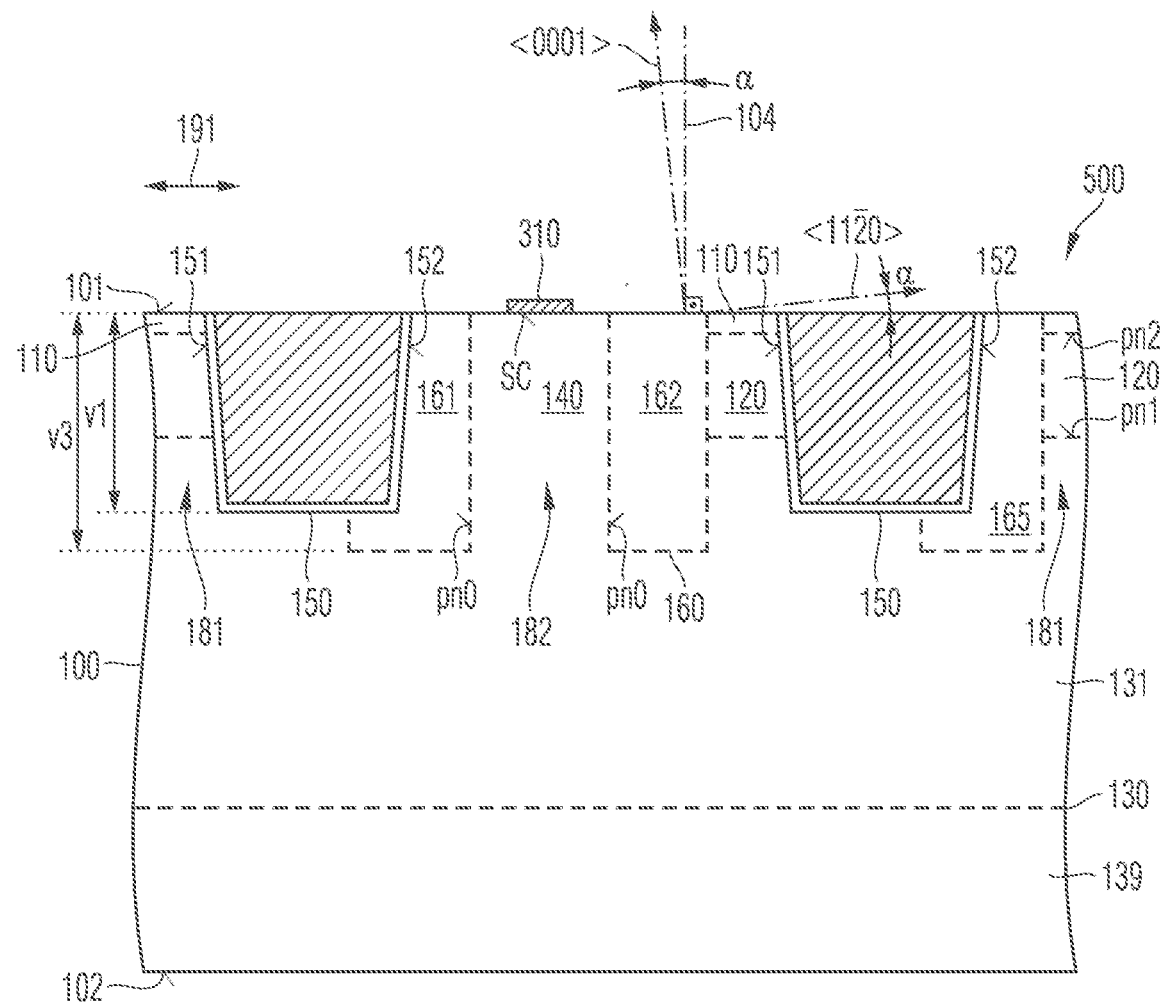

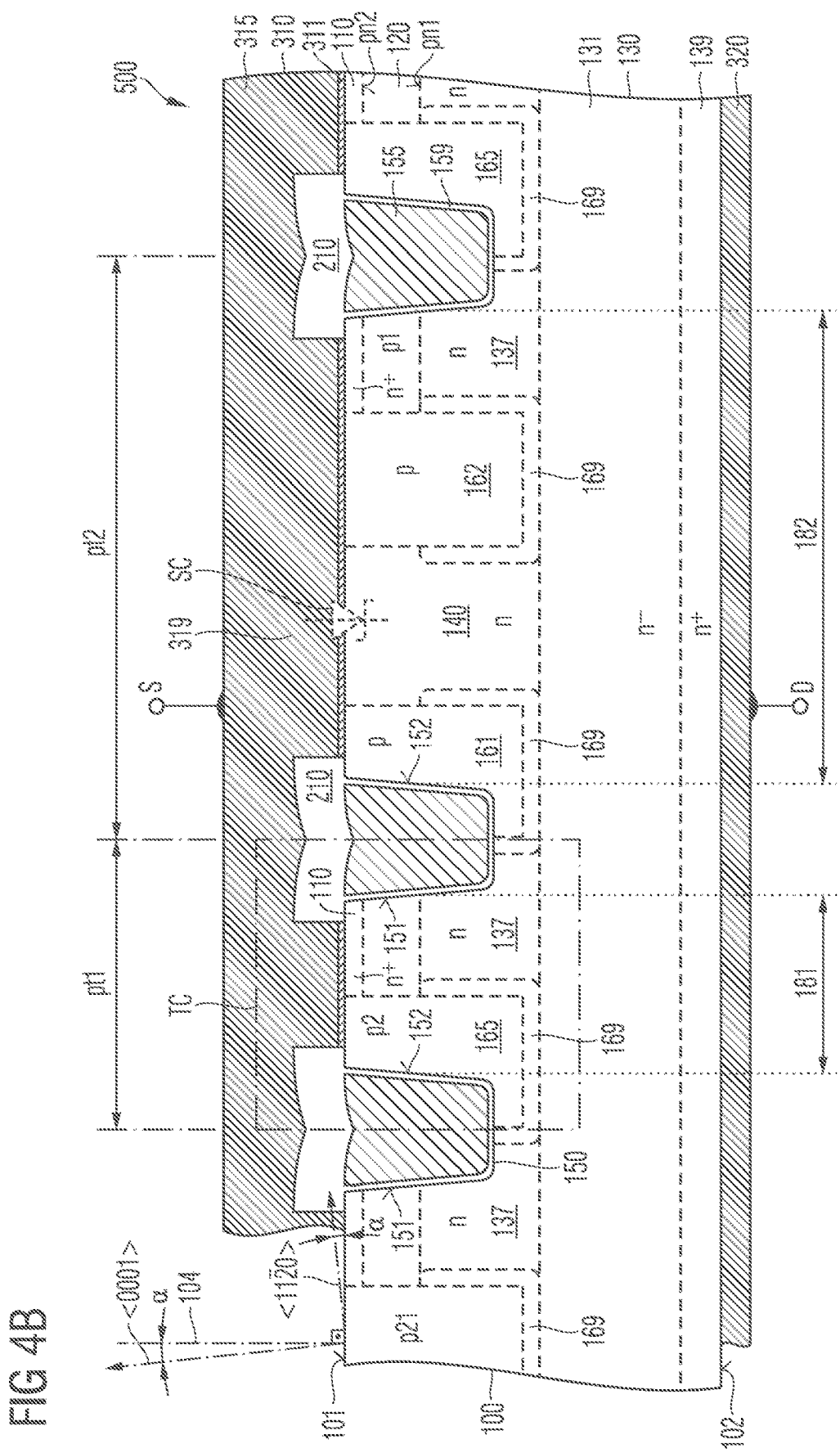

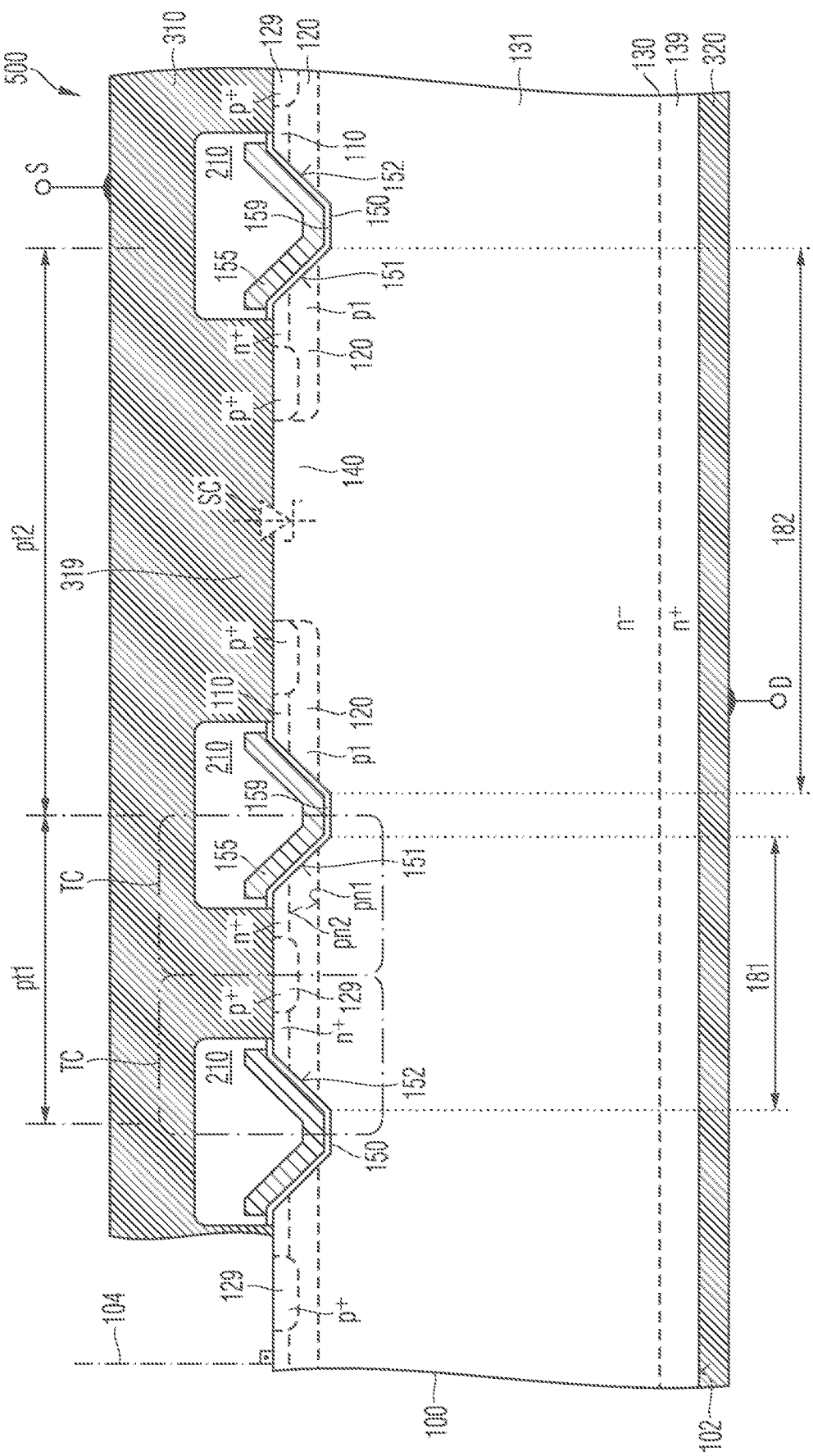

SILICON CARBIDE FIELD-EFFECT TRANSISTOR INCLUDING SHIELDING AREAS

TECHNICAL FIELD

The present application relates to SiC (silicon carbide) semiconductor components, for example semiconductor switches with low on resistance and high dielectric strength.

BACKGROUND

In semiconductor components with field-effect transistor structures and a drift zone, pn junctions between the drift zone and body areas of the field-effect transistor structures form an intrinsic body diode. In the case of operation of the body diode in forward direction, a bipolar charge carrier flow through the body areas and the drift zone is established. Electrical properties of the body diode, for example use voltage, forward voltage and current-carrying capacity, result from the doping and the dimensions of doped areas at semiconductor/metal junctions, which are in turn fixed with regard to the desired transistor properties.

It is a general aim to improve properties, for example avalanche robustness, breakdown resistance and/or on resistance, of SiC components.

SUMMARY

One working example of the present disclosure relates to a semiconductor component having a gate structure. The gate structure extends from a first surface into an SiC semiconductor body. A body area in the SiC semiconductor body adjoins a first side wall of the gate structure. The semiconductor component has a first and second shielding area of the conductivity type of the body area, and the first and second shielding area have at least twice as high a level of doping as the body area. A diode area forms a Schottky contact with a load electrode between the first shielding area and the second shielding area.

Another working example of the present disclosure relates to a semiconductor component. The semiconductor component in an SiC semiconductor body has diode areas of a first conductivity type. The diode areas each form a Schottky contact with a load electrode. In a horizontal first direction, at least one gate structure is formed between two adjacent diode areas. The at least one gate structure extends from a first surface into the SiC semiconductor body. At least one first side wall of the gate structure adjoins a body area of a second conductivity type electrically connected to the load electrode.

A further working example of the present disclosure relates to a semiconductor component with gate structures, wherein the gate structures extend from a first surface into an SiC semiconductor body. In the SiC semiconductor body, a drift zone of a first conductivity type is formed. First and second mesas of the SiC semiconductor body are arranged between the gate structures and comprise body areas of a second conductivity type. The body areas each adjoin first side walls of one of the gate structures. In the second mesas, first shielding areas of the second conductivity type each adjoin second side walls of one of the gate structures and second shielding areas of the second conductivity type adjoin body areas. Diode areas of the conductivity type of the drift zone each form Schottky contacts with a load electrode between the first and second shielding areas.

Further features and advantages of the subject matter disclosed will be apparent to the person skilled in the art on reading the detailed description that follows, on viewing the drawings and from the claims.

BRIEF DESCRIPTION OF THE DRAWINGS

The appended drawings impart a deeper understanding of working examples of a silicon carbide semiconductor component, are incorporated into the disclosure and form part thereof. The drawings merely illustrate embodiments and serve, together with the description, to elucidate the principles thereof. The silicon carbide semiconductor component described here is thus not limited to the working examples by the description thereof. Further working examples and intended advantages will be apparent from the understanding of the detailed description that follows and from combinations of the working examples described hereinafter, even if these are not described explicitly. The elements and structures shown in the drawings are not necessarily shown to scale with respect to one another. Identical reference numerals refer to identical or corresponding elements and structures.

FIG. 1 shows a vertical cross section through an SiC semiconductor component with a Schottky contact and two shielding areas in one embodiment.

FIG. 3 shows a vertical cross section through an SiC semiconductor component in one embodiment with transistor cells with a channel on one side.

FIGS. 4A to 4E show vertical cross sections through SiC semiconductor components with Schottky contacts and transistor cells with a channel on one side in further embodiments.

FIGS. 5A to 5B show vertical cross sections through SiC semiconductor components with Schottky contacts in embodiments with transistor cells with channels on both sides.

DETAILED DESCRIPTION

Figure 2A:
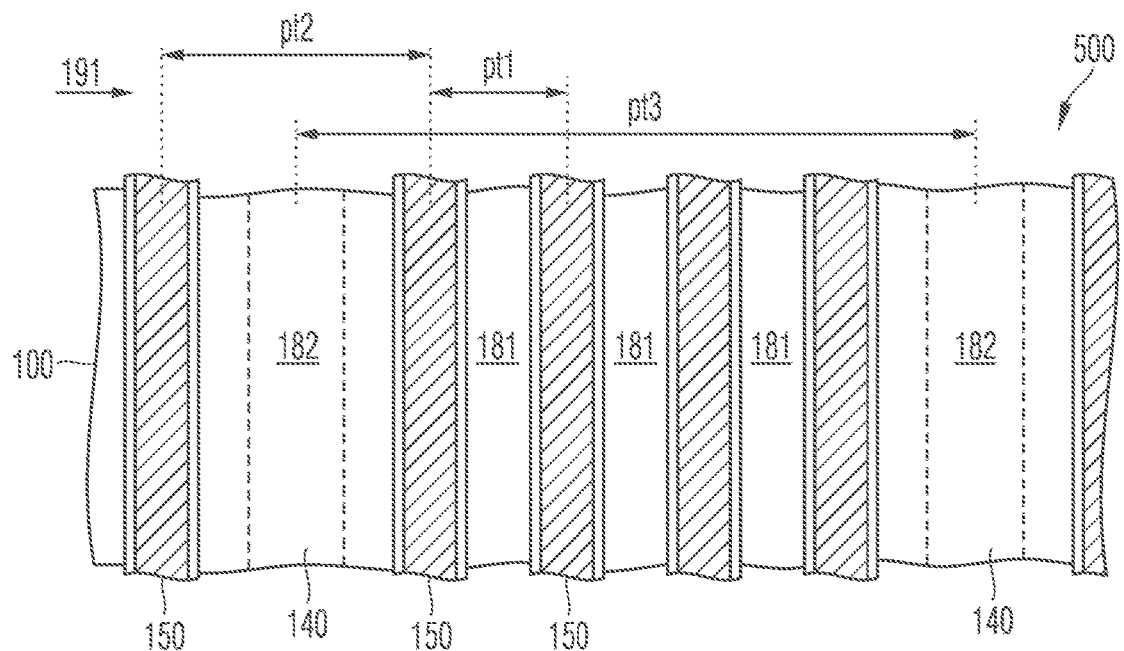
FIGS. 2A and 2B show a horizontal and vertical cross section through a semiconductor component in one embodiment with Schottky contacts and shielding areas formed between transistor cells.

The detailed description which follows makes reference to the accompanying drawings, which form part of the disclosure and in which specific working examples of an SiC semiconductor component are shown for illustration purposes. The existence of further working examples will be self-evident. It will likewise be self-evident that structural and/or logical alterations may be made to the working examples without departing from what has been defined by the claims. In that respect, the description of the working examples is non-limiting. More particularly, features of working examples described hereinafter can be combined with features of others of the working examples described, unless the opposite is apparent from the context.

The terms "have", "contain", "comprise", "include" and similar terms are unrestricted terms and show the presence of the structures, elements or features identified, but do not rule out the presence of additional elements or features. The indefinite articles and the definite articles shall encompass both the plural and singular unless the opposite is clearly apparent from the context.

The expression "electrically connected" describes a low-ohm connection between the electrically connected elements, for example direct contact between the elements in question or a connection via a metal and/or a highly doped semiconductor. The expression "electrically coupled" includes the possibility that one or more elements suitable for passage of current may be present between the "electrically coupled" elements, for example elements that are controllable in such a way that they can temporarily establish a low-ohm connection in a first state and a high-ohm decoupling in a second state.

The figures illustrate relative dopant concentrations by the signs of "−" or "+" alongside the doping type "n" or "p". For example, "n⁻" indicates a dopant concentration lower than the dopant concentration of an "n" doping area, whereas the dopant concentration in an "n⁺" doping area is higher than in an "n" doping area. Doping areas of the same relative dopant concentration do not necessarily have the same absolute dopant concentration. For example, two different "n" doping areas may have the same dopant concentration or different absolute dopant concentrations. The expression "dopant concentration" refers to a net dopant concentration, unless the opposite is apparent from the context.

If a range of values with the specification of a limit or two limits is defined for a physical parameter, the prepositions "from" and "to" or "less than" and "more than" include the respective limit. A statement of the "from . . . to" type is accordingly understood to mean "from at least . . . to at most". Correspondingly, a statement of the "less than . . . " ("more than . . . ") type is understood as "at most . . . " ("at least . . . ").

Main constituents of a layer or structure composed of a chemical compound or alloy are formed by the elements, the atoms of which enter into the chemical compound or alloy. For example, nickel and silicon are the main constituents of a nickel silicide layer, and copper and aluminum are the main constituents of a copper-aluminum alloy. The main constituents of a layer or structure of a substance mixture are the elements that are in a defined ratio to one another in the substance mixture. For example, the main constituents of a layer deposited by co-sputtering are the elements present in the targets used for the co-sputtering. As well as the main constituents, the layers or structures may include production-related impurities.

One working example of the present disclosure relates to a semiconductor component having a gate structure. The gate structure extends from a first surface into an SiC semiconductor body. A body area in the SiC semiconductor body adjoins a first side wall of the gate structure. The semiconductor component has a first and second shielding area of the conductivity type of the body area, and the first and second shielding area have at least twice as high a level of doping as the body area. A diode area forms a Schottky contact with a load electrode between the first shielding area and the second shielding area.

In some working examples, the first shielding area and the second shielding area may have different dimensions, for example different vertical extents and/or different lateral extents. In other working examples, the first and second shielding area may have identical lateral and vertical extents within the scope of manufacturing tolerances.

In general, the first shielding area and the second shielding area may have different dopant concentrations and/or different lateral and/or vertical dopant concentration profiles. However, it is also possible that the first shielding area and the second shielding area, within the scope of manufacturing tolerances, have identical dopant concentrations and/or lateral and/or vertical dopant concentration profiles.

The gate structure may have a gate electrode and be part of a transistor cell, in which case a voltage differential between the gate electrode and the body area controls an inversion channel in the body area. The inversion channel is formed by minority charge carriers of the body area that are enriched across the gate structure. The Schottky contact is electrically parallel to a body diode which is formed by pn junctions between the drift structure on the one hand and the body area and/or the shielding areas on the other hand. As a result of the lower use voltage of the Schottky contact, in the reverse-biased state of the semiconductor component and with the inversion channel turned off, by far the predominant portion of the backward current flows through the Schottky contact. A bipolar current through the body diode and degradation of the SiC crystal caused by such a bipolar current can be largely avoided.

While line inductances can delay the response of the Schottky diode in the case of an external Schottky diode connected electrically parallel to the semiconductor component and hence a bipolar current flow sufficient to trigger bipolar degradation through the body diode can be established for a brief period of time in every switching operation, the intrinsic Schottky contact with the inversion channel turned off reliably responds before the body diode.

The comparatively highly doped shielding areas can reduce the electrical field active at the Schottky contact and hence a leakage current that flows through the Schottky contact in the forward-biased state. For this purpose, the first and second shielding area may each directly adjoin the diode area and form pn junctions with the diode area.

A distance of a lower edge of the first and/or second shielding area from the first surface may be greater than a vertical extent of the gate structure, which means that the shielding effect of the shielding areas may be greater than achievable by body areas that may be much more lightly doped than the shielding areas.

Between the first surface and the body area, a source area may adjoin at least the first side wall of the gate structure, which means that, in the case of suitable actuation of a gate electrode formed in the gate structure, an inversion channel can form at least along the first side wall of the gate structure.

A semiconductor component with a multitude of electrically parallel-connected transistor cells of the same type has a multitude of gate structures and body areas, and each body area may in each case adjoin the first side wall of a gate structure. The first shielding area may adjoin one of the body areas on an opposite side from the diode area and the second shielding area may adjoin another of the body areas on an opposite side from the diode area, such that the body areas may be connected via the shielding areas via an ohmic junction, especially via a low-ohm junction, to the first load electrode on the front side of the semiconductor component.

The first and second shielding areas may each adjoin a contact structure on an opposite side from the diode area, which extends from the first surface into the SiC semiconductor body and enables low-ohm coupling to the shielding areas and the body areas.

The first shielding areas may each adjoin a second side wall of the gate structures and contribute to shielding of the gate structure.

The first shielding areas, for improvement of the shielding effect, may have a local dopant maximum in a first subsection between the gate structure and a second surface, opposite the first surface, of the SiC semiconductor body.

The first side walls of the gate structures may run parallel to a first main lattice plane and/or be tilted by at most 2° relative to the first main lattice plane in the SiC semiconductor body, such that, in SiC semiconductor bodies in which the (0001) lattice plane is tilted by an off-axis angle α of typically 4° relative to the surfaces on the front and reverse sides of the SiC semiconductor body, an inversion channel of a transistor cell can be formed in a lattice plane with high charge carrier mobility.

A semiconductor component with a multitude of electrically parallel-connected transistor cells of the same type has a corresponding multitude of gate structures. Between adjacent gate structures, the SiC semiconductor body may form firstly first mesas without diode areas and secondly second mesas with diode areas. In the first mesas, body areas may be formed by transistor cells. A first shielding area may adjoin a diode area only and a second shielding area may adjoin a diode area and a body area.

The first load electrode may have a first sublayer and a main layer, where at least one first section of the first sublayer adjoins the diode area and the main layer adjoins the first sublayer. The first sublayer may enable either a Schottky contact with a low barrier height and low use voltage (threshold voltage) or a low-ohm contact with p- and n-doped areas in the SiC semiconductor body.

Alternatively or additionally, the first load electrode may have a structured sublayer that adjoins at least the source area and/or at least one of the shielding areas, such that the properties of Schottky contact and ohmic contact connection of the doped areas can be decoupled.

Between the first surface and the first load electrode, an interlayer dielectric may be formed, which separates the first load electrode from the gate structures. The first load electrode may have Schottky contact structures that extend in a vertical direction across the diode areas through openings in the interlayer dielectric from the first load electrode at least to the diode areas, such that the Schottky contacts are connected directly and with low parasitic inductance.

The Schottky contact structures may each directly adjoin the diode areas and the two shielding areas in each case with which the diode area forms a pn junction in each case.

The diode area may have a lower subarea and, between the lower subarea and the first surface, an upper subarea, where a second average width of the lower subarea is greater than a first average width of the upper subarea. For example, the second average width of the lower subarea corresponds to at least 120% (or at least 130% or at least 150% or at least 180%) of the first average width of the upper subarea. A vertical extent of the lower subarea may be at least 50 nm or at least 100 nm. The widening of the diode area in the direction of the drift zone can make it possible for the voltage above which the backward current flows increasingly through the body diode to be increased indirectly. It may therefore be possible that the backward current up to a higher current is removed exclusively as unipolar current via the Schottky contacts SC, such that the bipolar degradation can be suppressed to a higher degree.

FIG. 1 shows a semiconductor component 500 which may, for example, be an IGFET (field-effect transistor with insulated gate), for example a MOSFET (metal oxide semiconductor FET), where the abbreviation MOSFET represents both FETs with a metallic gate electrode and FETs with a semiconductor gate electrode. The semiconductor component 500 may also be an IGBT (bipolar transistor with insulated gate) or an MCD (MOS-controlled diode).

The semiconductor component 500 is based on an SiC semiconductor body 100 formed with silicon carbide. For example, the SiC semiconductor body 100 includes or consists of a silicon carbide crystal, where the silicon carbide crystal, as well as the main silicon and carbon constituents, may have dopant atoms and/or impurities, for example hydrogen and/or oxygen atoms. The polytype of the silicon carbide crystal may, for example, be 2H, 6H, 15R or 4H.

A first surface 101 on the front side of the SiC semiconductor body 100 is planar or ribbed. A normal 104 to a planar first surface 101 or to a middle plane of a ribbed first surface 101 defines a vertical direction. Directions parallel to a planar first surface 101 or to the middle plane of a ribbed first surface 101 are horizontal and lateral directions.

The semiconductor component 500 has a transistor cell TC with a gate structure 150 that extends from the first surface 101 on the front side of the SiC semiconductor body 100 into the SiC semiconductor body 100. In the gate structure 150, a conductive gate electrode 155 is formed, which is electrically insulated from the SiC semiconductor body 100. A first side wall 151 of the gate structure 150 is adjoined by a body area 120 formed in the SiC semiconductor body 100. A gate dielectric 159 separates at least the body area 120 from the gate electrode 155.

The body area 120 forms a first pn junction pn1 with a drift structure 130 and a second pn junction pn2 with a source area 110. The source area 110 is formed between the body area 120 and the first surface 101. The body area 120 separates the source area 110 from the drift structure 130. The drift structure 130 is formed between the body area 120 and a second surface 102 of the SiC semiconductor body 100 opposite the first surface 101.

The body area 120 and the source area 110 may be electrically connected to a first load electrode 310. The first load electrode 310 may form a source terminal S of the semiconductor component 500 or be electrically connected or coupled to a source terminal S.

The drift structure 130 comprises at least one drift zone 131, and, in the case of a barrier, an electrical field active in the SiC semiconductor body 100 is dissipated predominantly by far within the drift zone 131. The doping and vertical extent of the drift zone 131 are designed in accordance with the nominal barrier capacity of the semiconductor component 500. The average doping in the drift zone 131 depends on the nominal barrier capacity and, for nominal barrier voltages between 400 V, especially 1200 V, and 10 kV may be within a range from $5 \times 10^{15}$ $cm^{-3}$ to $5 \times 10^{16}$ $cm^{-3}$. The vertical extent of the drift zone 131 for a semiconductor component 500 with a nominal breakdown voltage of 400 V, especially 1200 V, and an average doping of about $1 \times 10^{16}$ $cm^{-3}$ may be within a range from 3 μm to 13 μm.

The drift structure 130 may have a highly doped base area 139 that directly adjoins the second surface 102. The base area 139 may directly adjoin the drift zone 131. Alternatively, the drift structure 130, between the drift zone 131 and the highly doped base area 139, may have further doped areas of the conductivity type of the drift zone 131, and a maximum dopant concentration in the further doped areas may be higher than a maximum dopant concentration in the drift zone 131 and lower than in the base area 139. Alternatively or additionally, the drift structure 130, between the first surface 101 and the drift zone 131, may have further doped areas of the conductivity type of the drift zone 131, for example current distribution areas which are more highly doped than the drift zone 131 and which, in the on state, spread out a flow of charge carriers in lateral direction for the passage through the drift zone 131, and/or barrier areas of the conductivity type of the drift zone 131 which affect, for example reduce, the emitter efficiency of the body area 120 or of other doped areas of the conductivity type of the body area 120.

The drift structure 130 is electrically connected to a second load electrode 320. The second load electrode 320 may form a drain terminal D of the semiconductor component 500 or may be electrically connected or coupled to a drain terminal D.

A gate dielectric 159 is formed between the gate electrode 155 and the body area 120 and separates the gate electrode 155 from the body area 120. The gate dielectric 159 can also insulate the gate electrode 155 from other areas in the SiC semiconductor body 100. In one embodiment, the gate dielectric 159 can completely insulate the gate electrode 155 from the SiC semiconductor body 100. In other embodiments, the gate structure 150 may have further dielectric structures, where the further dielectric structures may have a higher layer thickness than the gate dielectric 159, a different physical composition than the gate dielectric 159 and/or at least one further dielectric material.

In the SiC semiconductor body 100, at least one first shielding area 161 and one second shielding area 162 are formed, each of which are of the conductivity type of the body area 120. A maximum dopant concentration in the first and second shielding areas 161, 162 is at least twice as high as in the body area 120.

Between the first and second shielding area 161, 162, a diode area 140 is formed, which directly adjoins the two shielding areas 161, 162 and can form a vertical pn junction pn0 with each of the two shielding areas 161, 162. The first shielding area 161 is present on the side of the diode area 140 facing the gate structure 150 and the second shielding area 162 is on the side of the diode area 140 facing away from the gate structure 150. A maximum width of the first shielding area 161 may be essentially, i.e. within the scope of manufacturing tolerances, equal to the maximum width of the second shielding area 162. A maximum vertical extent of the first shielding area 161 may be essentially equal to the maximum vertical extent of the second shielding area 162. The first and second shielding area 161, 162 may have largely identical lateral and vertical dopant concentration profiles.

The diode area 140 forms a Schottky contact SC with the first load electrode 310, where the Schottky contact SC is formed between the first and second shielding area 161, 162. The diode area 140 may directly adjoin the drift structure 130, for example the drift zone 131. A dopant concentration in the diode area 140 may correspond to the dopant concentration in the drift zone 131 or be higher than in the drift zone 131. In one embodiment, the average dopant concentration in the diode area 140 is at least twice the average dopant concentration in the drift zone 131. The Schottky contact SC may be formed along the first surface 101 and/or in a trench that extends from the first surface 101 into the SiC semiconductor body 100.

The description which follows relates to semiconductor components with an n-channel transistor cell TC. The description corresponds to those with a p-channel transistor cell. A sufficiently high voltage at the gate electrode 155 turns the transistor cell TC on. Along the gate dielectric 159, in the body area 120, an inversion channel is formed by the field effect. The inversion channel forms a continuous path from the source area 110 to the drift structure 130 for electrons and enables a load current flow through the body area 120.

A drop in the voltage at the gate electrode 155 below a threshold voltage turns the transistor cells TC off and blocks the semiconductor component 500. The potential of the first and second shielding area 161, 162 corresponds to the potential of the first load electrode 310, and so the first and second shielding area 161, 162 shield the Schottky contact SC from the potential of the second load electrode 320. In addition, the first and second shielding area 161, 162 can pin a voltage breakdown in the region of horizontal pn junctions pn3 between the shielding areas 161, 162 and the drift structure 130.

In the reverse-biased state of the semiconductor component 500, the first pn junction pn1 is poled in forward direction, such that a backward current can flow between the second load electrode 320 and the first load electrode 310 via the first pn junction pn1 and the body area 120 if the drop in voltage across the first pn junction pn1 exceeds the use voltage of the body diode formed by the first pn junction pn1.

A current through the first pn junction pn1 is a bipolar charge carrier flow of holes and electrons. In the vicinity of pn junctions and in areas with a high change in dopant concentration, there is enhanced recombination of holes and electrons. The energy released here promotes the growth of crystallographic defects that increasingly damage the SiC crystal. For example, dislocations between lattice planes (basal plane dislocations, BPDs) can be transformed into stacking faults (SFs) which, in silicon carbide of the 4H polytype, propagate primarily along the <0001> lattice planes and hence usually transverse to the main current flow direction in the drift structure 130 and increasingly hinder the flow of current between the second load electrode 320 and the first load electrode 310.

Since the Schottky contact SC has a lower barrier height and lower forward voltage than the first pn junction pn1, the Schottky contact SC responds before the body diode, and so, in the semiconductor component 500 in the reverse-biased state and with the inversion channel of the transistor cells TC turned off, the current at first flows by far predominantly through the Schottky contact SC. For example, the use voltage of the body diode at 25° C. may be at least 2.7 V. The current flow through the turned-on transistor cells TC is unipolar and consists solely of a single type of charge carriers, and so, even in the on state of the transistor cells TC, there is no significant recombination in the drift structure 130. Neither with the inversion channel turned on nor with the inversion channel turned off is there any recombination of charge carriers to an extent that can lead to significant growth of stacking errors.

With rising current through the Schottky contact SC, there is a rise in the voltage drop across the Schottky contact SC. The properties of the Schottky contact SC can thus be dimensioned such that, on operation of the semiconductor component 500 within the absolute maximum ratings, the voltage drop across the Schottky contact SC always remains smaller than the use voltage of the intrinsic body diode.

In customary applications, for example in bridge circuits or in the rectifier stages of low-voltage DC/DC converters, for the backward-conducting state, the transistor channel is typically opened by applying a suitable gate voltage, such that a current flows through the first pn junction pn1 only for a comparatively short time. However, the transistor channel is turned on only after a certain minimum wait time (also called dead time) in order to prevent a short circuit in a bridge circuit, for example, via simultaneously turned-on low-side and high-side switches. In applications with long dead times or high switching frequencies, therefore, a brief flow of current through the first pn junction pn1 can contribute significantly to the switching losses.

By virtue of the lower use voltage of the Schottky contact SC and its low forward voltage in relation to the use voltage of the bipolar diode formed by the first pn junction pn1, the backward current in the semiconductor component 500 flows by far predominantly via the Schottky contacts SC and generates lower losses therein. Moreover, the current flow through the Schottky contact SC is a unipolar flow of charge carriers that does not contribute to bipolar degradation.

The comparatively highly doped first and second shielding areas 161, 162 shield the Schottky contact SC from high electrical fields and in this way reduce the leakage current through the Schottky contact SC. Moreover, the first and second shielding areas 161, 162 improve the surge current capability of the Schottky contacts SC.

In one embodiment, a separation v3 of a lower edge of the first and second shielding areas 161, 162 from the first surface 101 is greater than a vertical extent v1 of the gate structure 150 and hence greater than a separation of a lower edge of the body areas 120 from the first surface 101. The comparatively large vertical extent of the first and second shielding area 161, 162 and the large separation between the lower edge of the first and second shielding area 161, 162 on the one hand and the Schottky contact SC on the other hand can improve the shielding effect.

In one embodiment, the first shielding area 161 may adjoin a second side wall 152 of the gate structure 150, such that a shielding effect of the first shielding area 161 both on the Schottky contact SC and on a lower edge of the gate structure 150 is displayed.

Figure 2B:
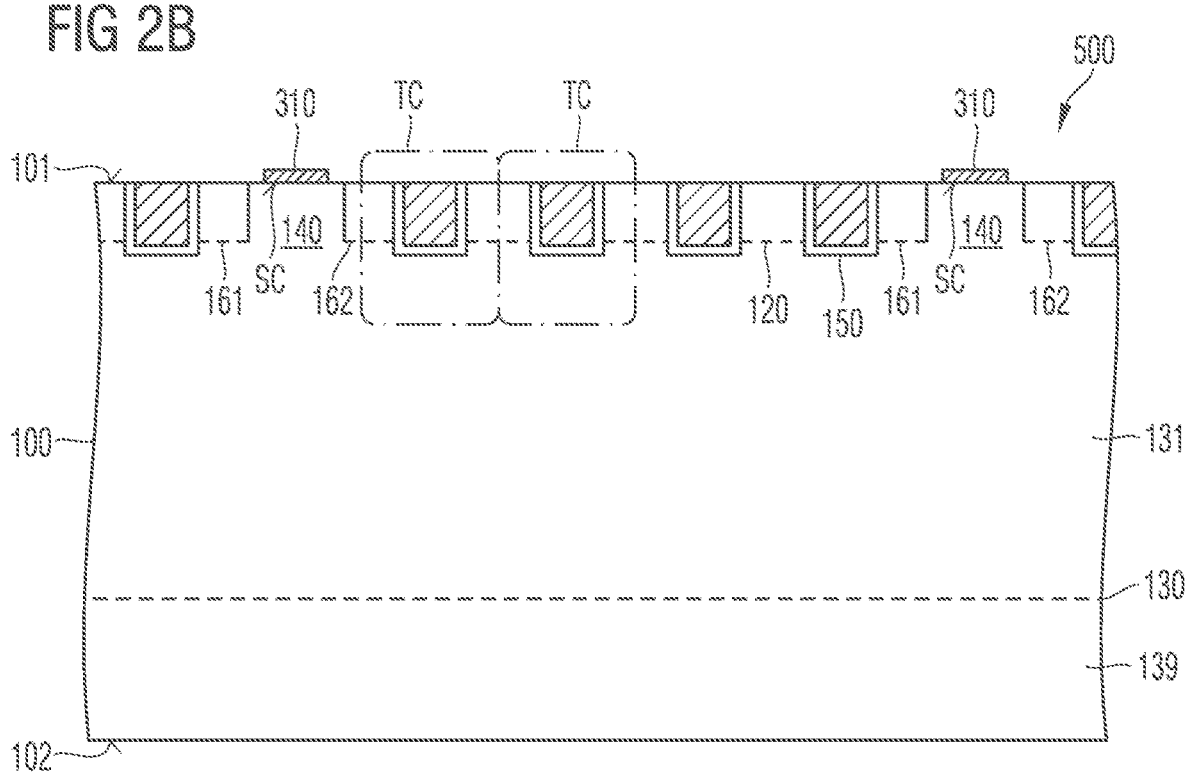

FIGS. 2A and 2B show a semiconductor component 500 with multiple gate structures 150 having a horizontal longitudinal extent orthogonal to a horizontal first direction 191. The gate structures 150 may take the form of straight stripes. Some of the gate structures 150 may be arranged in an equal first middle-to-middle separation (pitch) pt1 from one another. Sections of the SiC semiconductor body 100 between any two adjacent gate structures 150 with the first middle-to-middle separation pt1 may form first mesas 181 in the form of stripes, in which body areas 120 of transistor cells TC may be formed, with formation of inversion channels in the body areas 120 in the on state of the semiconductor component 500.

Sections of the SiC semiconductor body 100 between any two adjacent gate structures 150 with a second middle-to-middle separation pt2 may form second mesas 182 in the form of stripes, in each of which one or more parallel diode areas 140 in the form of stripes may be formed. The diode areas 140 each form Schottky contacts SC with a first load electrode 310 between two gate structures 150 in an adjacent arrangement with the second middle-to-middle separation pt2.

Between the two gate structures 150 in an adjacent arrangement with the second middle-to-middle separation pt2, it is also possible for first and second shielding areas 161, 162 and further shielding areas to be formed, each of which form vertical pn junctions pn0 with the diode areas 140. The second middle-to-middle separation pt2 may be greater than the first middle-to-middle separation pt1. For example, the first middle-to-middle separation pt1 is at least 40% and at most 60% of the second middle-to-middle separation pt2.

In one embodiment, the second middle-to-middle separation pt2 is an integer multiple of the first middle-to-middle separation pt1, and so the arrangement of the Schottky contacts SC can result from simple omission of individual gate structures 150, source areas 110 and body areas 120 from a regular pattern. If pt2 is more than twice pt1, more than one diode area 140 may be formed in a second mesa 182 in the horizontal first direction.

A third middle-to-middle separation pt3 between adjacent diode areas 140 may likewise be an integer multiple of the first middle-to-middle separation pt1. For example, pt3≥3× pt1, and so at least three gate structures 150 are formed between two adjacent diode areas 140. The third middle-to-middle separation pt3 may vary over the SiC semiconductor body 100, for example increase or decrease toward the middle of the SiC semiconductor body 100.

For example, within a transistor cell field, the area proportion of the diode areas 140 at the first surface 101 may be at least 15% and at most 50%, and so, even at the maximum permissible backward current for the semiconductor component 500, a voltage drop across the Schottky contacts SC remains reliably below the use voltage of the body diode.

The transistor cells TC may be those with an inversion channel on one side or those with an inversion channel on two sides. In the embodiment shown, the body regions 120 directly adjoin a first and a second, opposite side wall of the gate structures 150.

In FIG. 3, the semiconductor component 500 is based on an SiC semiconductor body 100 that has a silicon carbide crystal of the 4H polytype. The <0001> lattice direction may be tilted relative to the normal 104 by an off-axis angle α between 2° and 8°. The <11-20> lattice direction is tilted by the off-axis angle α relative to the first surface 101 and runs parallel to the plane of the cross section. The <1-100> lattice direction runs orthogonally to the plane of the cross section and to the horizontal first direction 191. First side walls 151 of gate structures 150 run parallel to (11-20) lattice planes with high charge carrier mobility and/or deviate by a maximum of 2° from an alignment of the (11-20) lattice planes. Second side walls 152 opposite the first side walls 151 may deviate from the alignment of the (11-20) lattice planes by twice the off-axis angle α and/or deviate from the alignment of the (11-20) lattice planes by a maximum of 2° from twice the off-axis angle α.

Sections of the SiC semiconductor body 100 between the gate structures 150 form first mesas 181 and second mesas 182. In the first mesas 181 and in the second mesas 182, body areas 120 may be formed, which each adjoin a first side wall 151 of a first adjacent gate structure 150. The first mesas 181 may additionally each have a further shielding area 165 which adjoins a second side wall 152 of the second adjacent gate structure 150. The body area 120 may, for example, be spaced apart from the second adjacent gate structure 150 by means of the further shielding area 165 within the same first mesa 181.

In the second mesas 182, a first shielding area 161 and a second shielding area 162 are each formed. The first shielding area 161 adjoins a second side wall 152 of the second adjacent gate structure 150. The second shielding area 162 may be spaced apart from the first adjacent gate structure 150. For example, the second shielding area 162 may adjoin the body area 120 and a source area 110 in the same second mesa 182.

The first, second and further shielding areas 161, 162, 165 may have roughly equal maximum widths and/or equal maximum vertical extents and/or largely identical lateral and vertical dopant concentration profiles.

A diode area 140 may be formed between the first and second shielding area 161, 162. The diode area 140 may form pn junctions pn0 with the first and second shielding area 161, 162 and a Schottky contact SC with a first load electrode 310.

Figure 4A:
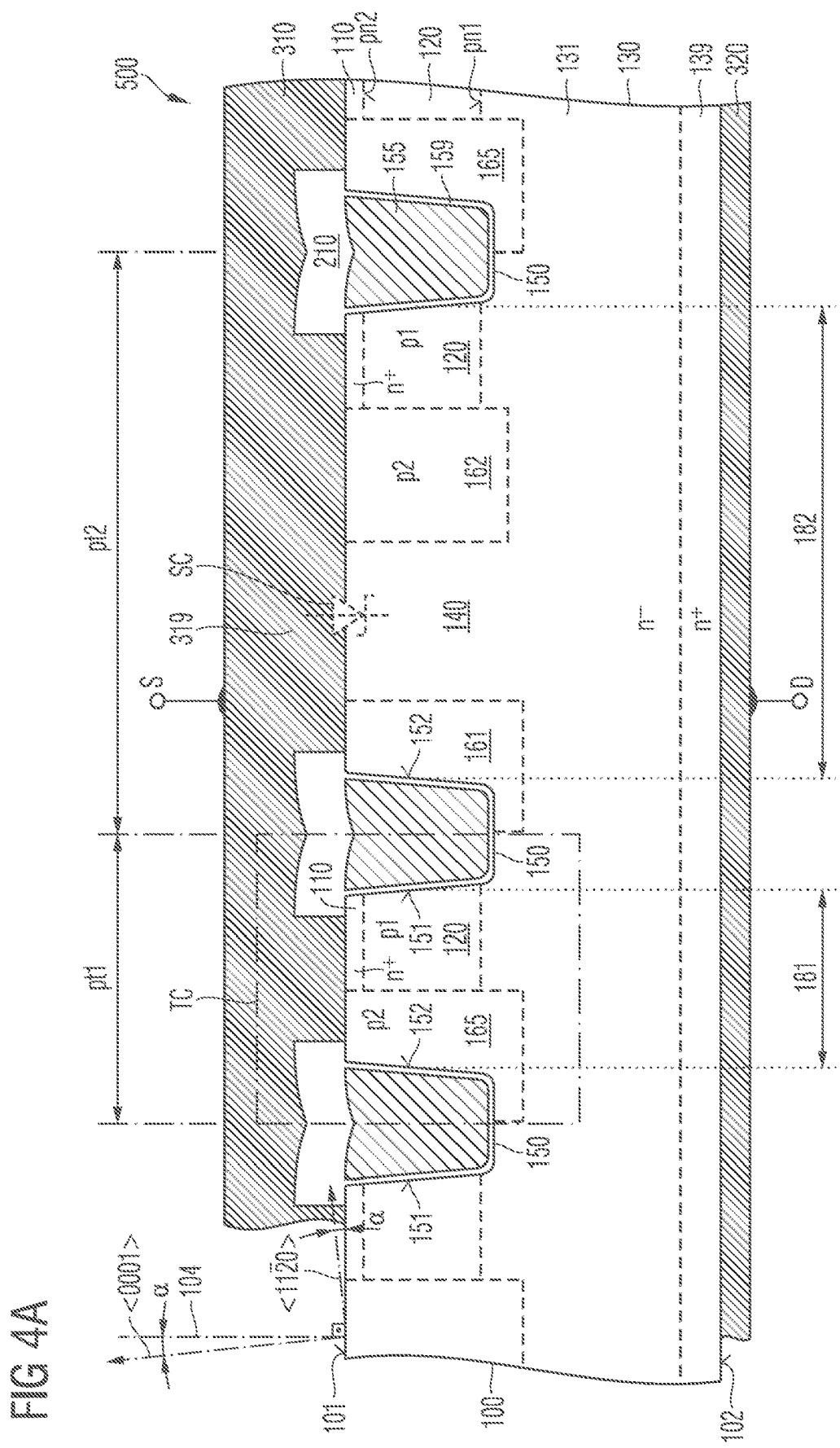

FIG. 4A shows an embodiment in which a second middle-to-middle separation pt2 between two gate structures 150 on opposite sides of a diode area 140 is twice a first middle-to-middle separation pt1 on either side of a first mesa 181. In each of the first mesas 181, one transistor cell TC is formed.

An interlayer dielectric 210 separates a first load electrode 310 from the gate electrodes 155 in the gate structures 150. The first load electrode 310 may comprise a Schottky contact structure 319 which extends in vertical direction through the interlayer dielectric directly from the load electrode 310 to the diode area 140. The Schottky contact structure 319 may also directly adjoin the first and second shielding area 161, 162 and form ohmic junctions with the first and second shielding area 161, 162.

In FIG. 4B, the diode areas 140 have at least twice as high a level of doping as the drift zone 131. Between the body areas 120 and the drift zone 131, current distribution areas 137 may be formed, which directly adjoin the first side walls 151 of the gate structures 150 and, in the on state of the semiconductor component 500, spread out a load current laterally in the direction of the drift zone 131. The current distribution areas 137 have a higher dopant concentration than the drift zone 131.

The current distribution areas 137 may each extend from one adjoining shielding area 161, 162, 165 to the other adjoining shielding area 161, 162, 165. The separation of a lower edge of the current distribution areas 137 from the first surface 101 may be less than, equal to or greater than the separation of a lower edge of the shielding areas 161, 162, 165 from the first surface 101.

In one embodiment, the diode areas 140 and the current distribution areas 137 may have the same dopant concentration and the same vertical dopant concentration profile. For example, the diode areas 140 and the current distribution areas 137 may originate from the same production process, for example from n-doped epitaxy or by implanting dopant atoms in the same implantation process.

The first, second and further shielding areas 161, 162, 165 may each have a subarea 169 having a greater separation from the first surface 101 than a lower edge of the gate structures 150. In the subareas 169, a vertical dopant concentration profile in the first, second and further shielding areas 161, 162, 165 may in each case have a local maximum. The vertical dopant concentration profiles in the first, second and further shielding areas 161, 162, 165 may have an absolute or global maximum in a section between the first surface 101 and a lower edge of the gate structure 150.

The first load electrode 310 may have a first sublayer 311 which may directly adjoin the first surface 101 in the region of the first and second mesas 181, 182. The first sublayer 311 may include or consist of a material that firstly has a suitable work function for a Schottky contact SC and secondly forms a reliable low-ohm contact both with p-doped and n-doped areas in silicon carbide. For example, the first sublayer 311 includes nickel-aluminum (NiAl) and/or doped polycrystalline silicon or consists of NiAl, doped polycrystalline silicon or both. In addition, the first load electrode 310 may have a main layer 315 of, for example, copper, aluminum, an alloy of aluminum and copper, an alloy of aluminum and silicon, or an alloy of aluminum, copper and silicon.

Figure 4C:
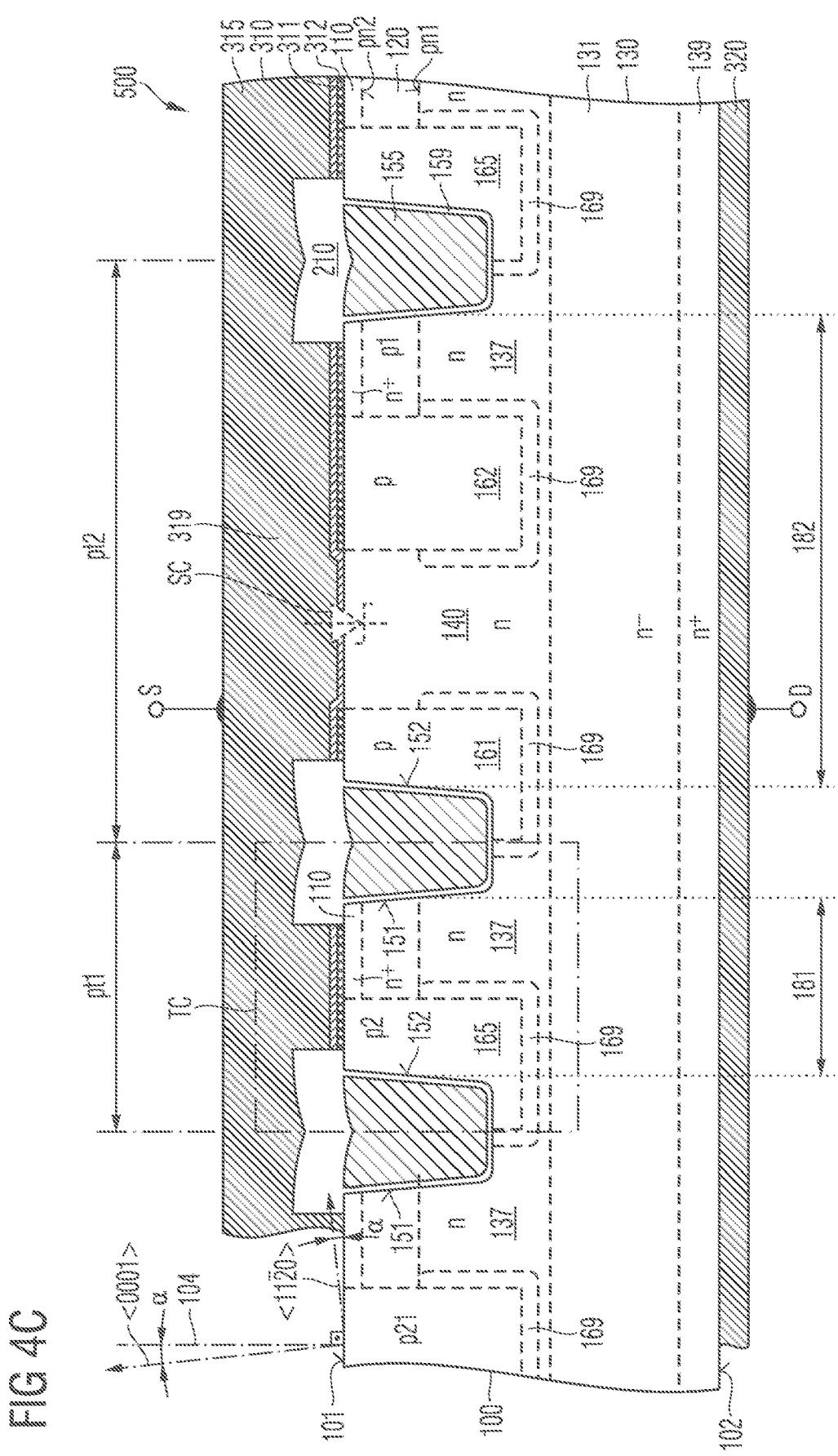

In FIG. 4C, the first load electrode 310 has a structured second sublayer 312 which directly adjoins the first surface 101 in the region of the first mesas 181 and, in the region of the second mesas 182, may selectively adjoin the first surface 101 in the region of the first and second shielding areas 161, 162 and the source areas 110 and is absent over at least a section of the diode areas 140. The second sublayer 312 may be formed from or consist of a material that forms a reliable ohmic contact, especially a low-ohm contact, both with p-doped and with n-doped areas in silicon carbide. For example, the second sublayer 312 includes NiAl or consists of NiAl.

The first sublayer 311 directly adjoins the first surface 101 in the region of the diode areas 140 and may otherwise be spaced apart from the first surface 101 by the second sublayer 312. The first sublayer 311 may include or consist of a material having a suitable work function with respect to silicon carbide, for example an elemental transition metal or a transition metal nitride, e.g. Ti, TiN or MoN. Since the second sublayer 312, prior to the deposition of the first sublayer 311, can be deposited, activated and structured, the formation of the first sublayer 311 can remain unaffected by the second sublayer 312.

The first surface 101 of the SiC semiconductor body 100 may be flat and even in the region of the first and second mesas 181, 182, as shown in FIGS. 4A-4C. Other embodiments may provide for further trench structures which extend into the SiC semiconductor body 100 in addition to the gate structures 150 in the region of the first and/or second mesas 181, 182. The further trench structures do not have any conductive structures directly connected to the gate electrodes 155. For example, the further trench structures do not have any conductive structures or have only those conductive structures that have no further electrical connection ("floating") to the first load electrode 310, to an auxiliary terminal of the semiconductor component and/or to an internal network node of the semiconductor component.

Figure 4D:
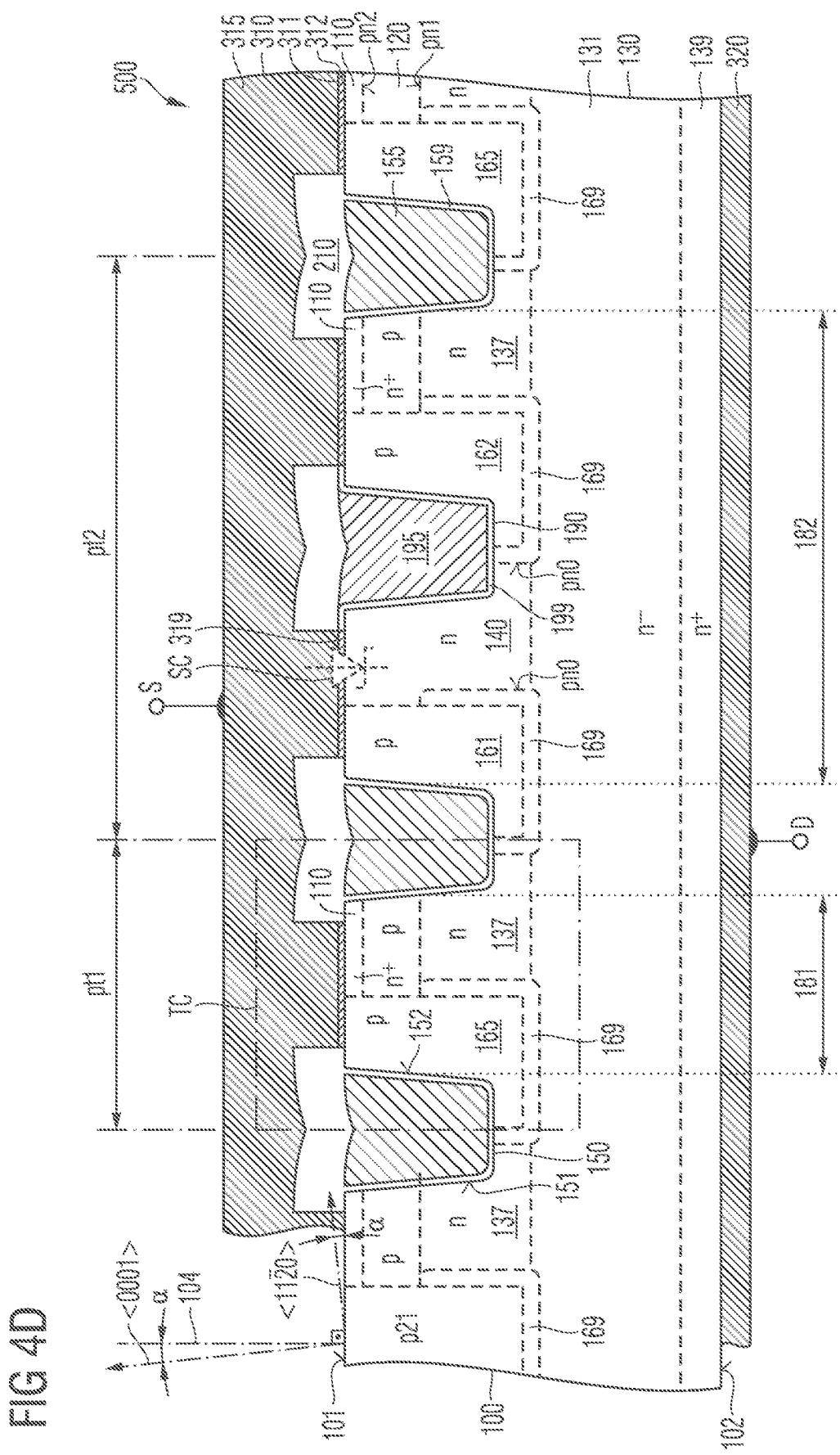

In FIG. 4D, between the diode area 140 and the second shielding area 162, an auxiliary trench structure 190 extends from the first surface 101 into the second mesa 182. The auxiliary trench structure 190 may include a conductive auxiliary material 195 and an auxiliary dielectric 199 and the auxiliary dielectric 199 separates the auxiliary material 195 from the SiC semiconductor body 100.

The auxiliary trench structure 190 may have the same dimensions as the gate structure 150 or differ from the gate structure 150 in at least one dimension, for example in depth, horizontal width or horizontal longitudinal extent. The auxiliary dielectric 199 may comprise the same material or the same materials, the same structural configuration and the same layer thickness as the gate dielectric 159, or differ in at least one structural feature from the gate dielectric 159. The auxiliary material 195 may comprise the same material or the same materials as the gate electrode 155.

The auxiliary material 195 may be electrically separated from the gate electrode 155. For example, the auxiliary material 195 is electrically unconnected or electrically connected to the first load electrode 310. Proceeding from a comparable component without a Schottky contact, the semiconductor component 500 of FIG. 4D can be formed with only slight changes in implantation masks for the source areas 110 and the body areas 120 and in an etching mask for contact connection of the gate electrodes 155 and the auxiliary material 195.

Figure 4E:
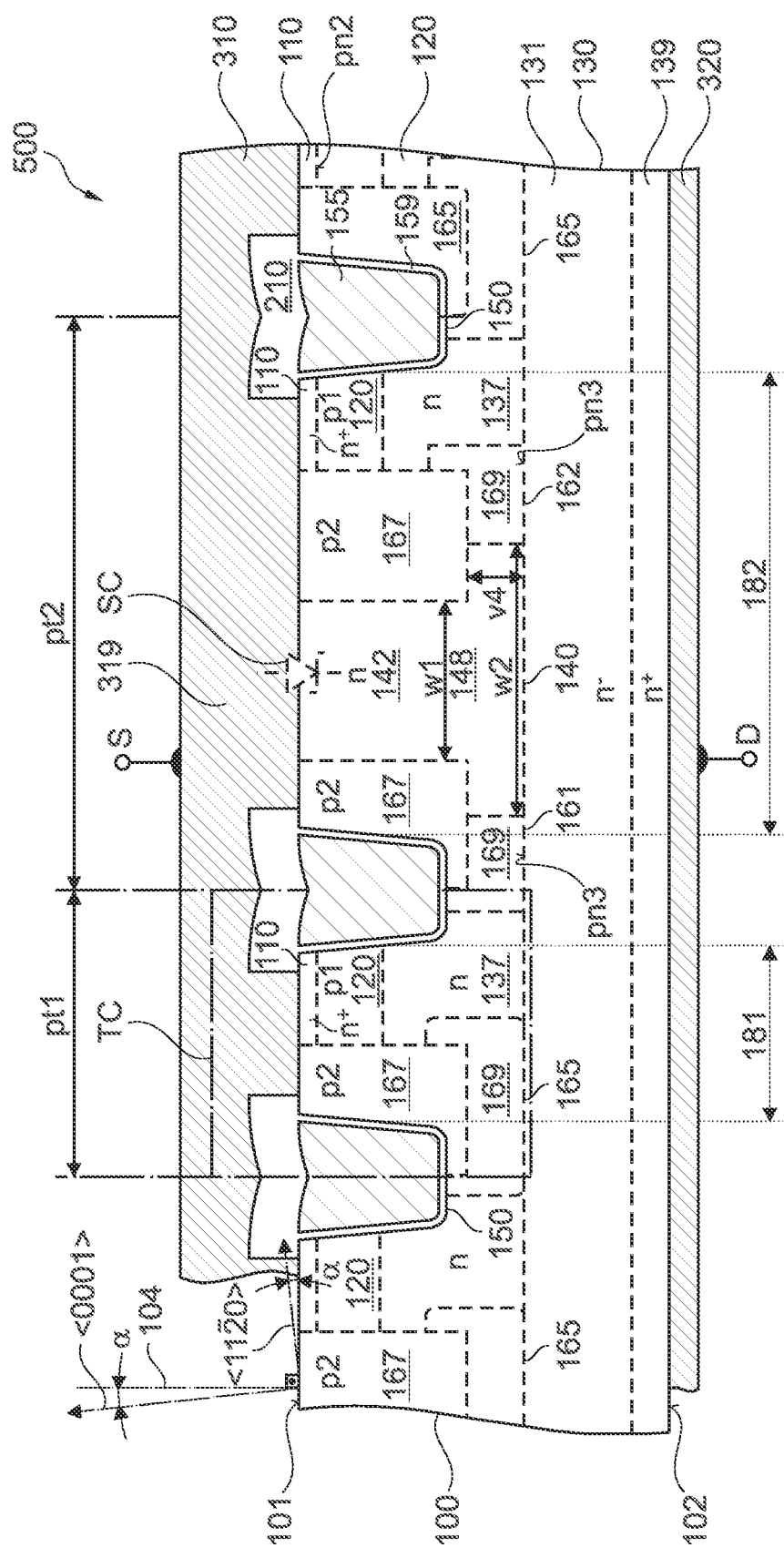

FIG. 4E shows a semiconductor component 500 having gate structures 150, a drift structure 130 with a drift zone 131, current distribution areas 137, first, second and further shielding areas 161, 162, 165 and transistor cells TC as described above in relation to FIGS. 4A-4C. A diode area 140 between the first and second shielding area 161, 162 has at least twice as high a level of doping as the drift zone 131. A lower section of the diode area 140 has the same distance from the first surface 101 as the current distribution areas 137 and may have a similar or the same vertical dopant concentration profile as the current distribution areas 137. The separation of a lower edge of the current distribution areas 137 from the first surface 101 may be less than, equal to or greater than the separation of a lower edge of the first, second and further shielding areas 161, 162, 165 from the first surface 101.

The first, second and further shielding areas 161, 162, 165 each have a subarea 169 and a main area 167 between the first surface 101 and the subarea 169. In the subarea 169, the vertical dopant concentration profiles in the first, second and further shielding areas 161, 162, 165 may each have a local maximum.

The subareas 169 of the further shielding areas 165 may each project laterally beyond the outer edge of the main area 167 of the further shielding area 165. However, it is also possible that the subareas 169 of the further shielding areas 165, within the scope of manufacturing tolerances, conclude laterally flush with the outer edge of the main area 167 of the further shielding area 165.

The subarea 169 of the first shielding area 161 may be retracted from a lateral edge between the main area 167 of the first shielding area 161 and the diode area 140. The subarea 169 of the second shielding area 162 may be retracted from the lateral edge of the main area 167 of the second shielding area 162 to the diode area 140. However, it is also possible that the subarea 169 of the first shielding area 161 and/or the subarea of the second shielding area 162, within the scope of manufacturing tolerances, conclude laterally flush with the outer edge of the main area 167 of the first shielding area 161 or of the second shielding area 162.

The representation of the junctions between the first, second and further shielding areas 161, 162, 165 on the one hand and the adjoining doped areas, for example to the diode area 140, is greatly simplified in the figures. In fact, the junctions do not run along planar faces and are not strictly orthogonal. The junctions are instead wavy, and projections shown in angular form are in fact curved. Such a wavy profile can result in the abovementioned manufacturing tolerances.

The diode area 140 has a lower subarea 148 and an upper subarea 142, where the upper subarea 142 may extend from the first surface 101 as far as the lower subarea 148. The upper subarea 142 of the diode area 140 is formed laterally between the main areas 167 of two adjacent first and second shielding areas 161, 162 and has a first average width w1. The lower subarea 148 is formed between the subareas 169 of the two adjacent first and second shielding areas 161, 162 and has a second average width w2. The second average width w2 may be at least 120% of the first average width w1. In some working examples, the first average width w1 and the second average width w2 may be equal. A vertical extent v4 of the lower subarea 148 is at least 50 nm, for example at least 100 nm.

The lateral width of horizontal sections of the pn junctions pn3 between the first and second shielding areas 161, 162 on the one hand and sections of the drift structure 130, especially of the drift zone 131 with a low doping level, on the other hand is distinctly reduced. A relatively high proportion of the pn junctions between the lower edges of the first and second shielding areas 161, 162 on the one hand and the Schottky contact SC on the other hand are pn junctions to the diode area 140 having a higher doping level than the drift zone 131.

By virtue of the higher conductivity of the diode area 140 along the pn junctions between the first and second shielding areas 161, 162 on the one hand and the diode area 140 on the other hand, for a given current through the Schottky contact SC, the voltage drop along the pn junctions can be reduced. This can move the voltage from which the body diode bears the backward current. The backward current can be removed up to a relatively high current level exclusively or virtually exclusively as unipolar current via the Schottky contacts SC, and so the bipolar degradation mechanism can be largely suppressed.

The lateral extent of the lower subarea 148 may be adjusted, for example, by variation in width of an opening in an implantation mask for formation of the subareas 169 of the first, second and further shielding areas 161, 162, 165. A further change in an implantation mask for formation of the main areas 167 of the first, second and further shielding areas 161, 162, 165 can also reduce the first average width w1, and so, in the upper subarea 142, the shielding effect of the first and second shielding areas 161, 162 on the Schottky contact SC can be further improved. The second middle-to-middle separation pt2 between two gate structures 150 on opposite sides of a Schottky contact SC can at the same time remain unchanged. The area of the contact regions along the first surface 101 and hence the contact resistance to the first, second and further shielding areas 161, 162, 165 and to the source areas 110 can remain unaffected.

FIG. 5A relates to a semiconductor component 500 with diode areas 140 of a first conductivity type in an SiC semiconductor body 100, wherein the diode areas 140 each form a Schottky contact SC with a load electrode 310. In a horizontal first direction at least one gate structure 150 may be formed between every two adjacent diode areas 140. The gate structures 150 extend from a first surface 101 into the SiC semiconductor body 100. At least one first side wall 151 of the gate structures 150 adjoins a body area 120 of a second conductivity type electrically connected to the load electrode 310.

The gate structures 150 may be formed in trenches with a nearly V-shaped vertical cross-sectional area. The gate electrode 155 may be formed in a nearly homogeneous layer thickness along the side walls and the base of the gate structure 150. Both side walls 151, 152 may be formed parallel to lattice planes with equal or about the same level of charge carrier mobility.

Sections of the SiC semiconductor body 100 between the gate structures 150 form first mesas 181 and second mesas 182. The first mesas 181 may each comprise a body area 120 that may extend from a second side wall 152 of a first adjacent gate structure 150 up to a first side wall 151 of a second adjacent gate structure 150. The first mesas 181 may each have source areas 110 along the two adjacent gate structures 150. Between the source areas 110, the body area 120 may have a highly doped body contact area 129 that may extend from the first surface 101 into the body area 120. The first mesas 181 may each comprise two transistor cells TC.

The second mesas 182 may likewise each comprise two transistor cells TC that each adjoin one of the two adjacent gate structures 150. Between the two transistor cells TC, a Schottky contact SC is formed between the load electrode 310 and a diode area 140. In lateral direction, the diode area 140 may in each case adjoin one of the body areas 120 and/or one of the body contact areas 129.

A second middle-to-middle separation pt2 between two gate structures 150 on opposite sides of a Schottky contact SC may be an integer multiple of a first middle-to-middle separation pt1 between two adjacent gate structures on either side of a first mesa 181.

Figure 5B:
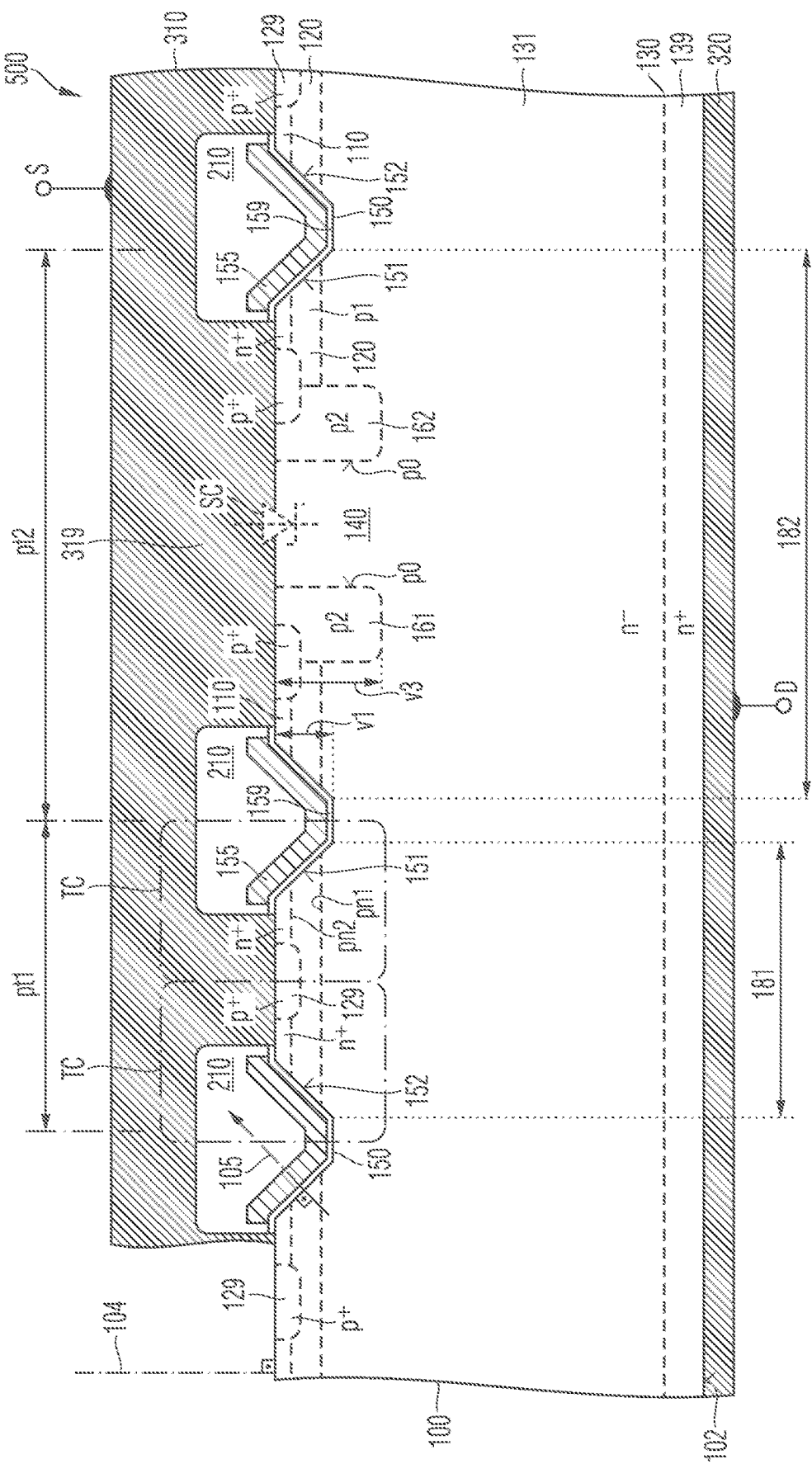

According to FIG. 5B, on either side of the Schottky contact SC, deep first and second shielding areas 161, 162 may extend from the first surface 101 into the SiC semiconductor body 100, and a vertical separation v3 of the lower edges of the first and second shielding areas 161, 162 from the first surface 101 may be greater than a vertical extent v1 of the gate structures 150 in the SiC semiconductor body 100.

Figure 6:
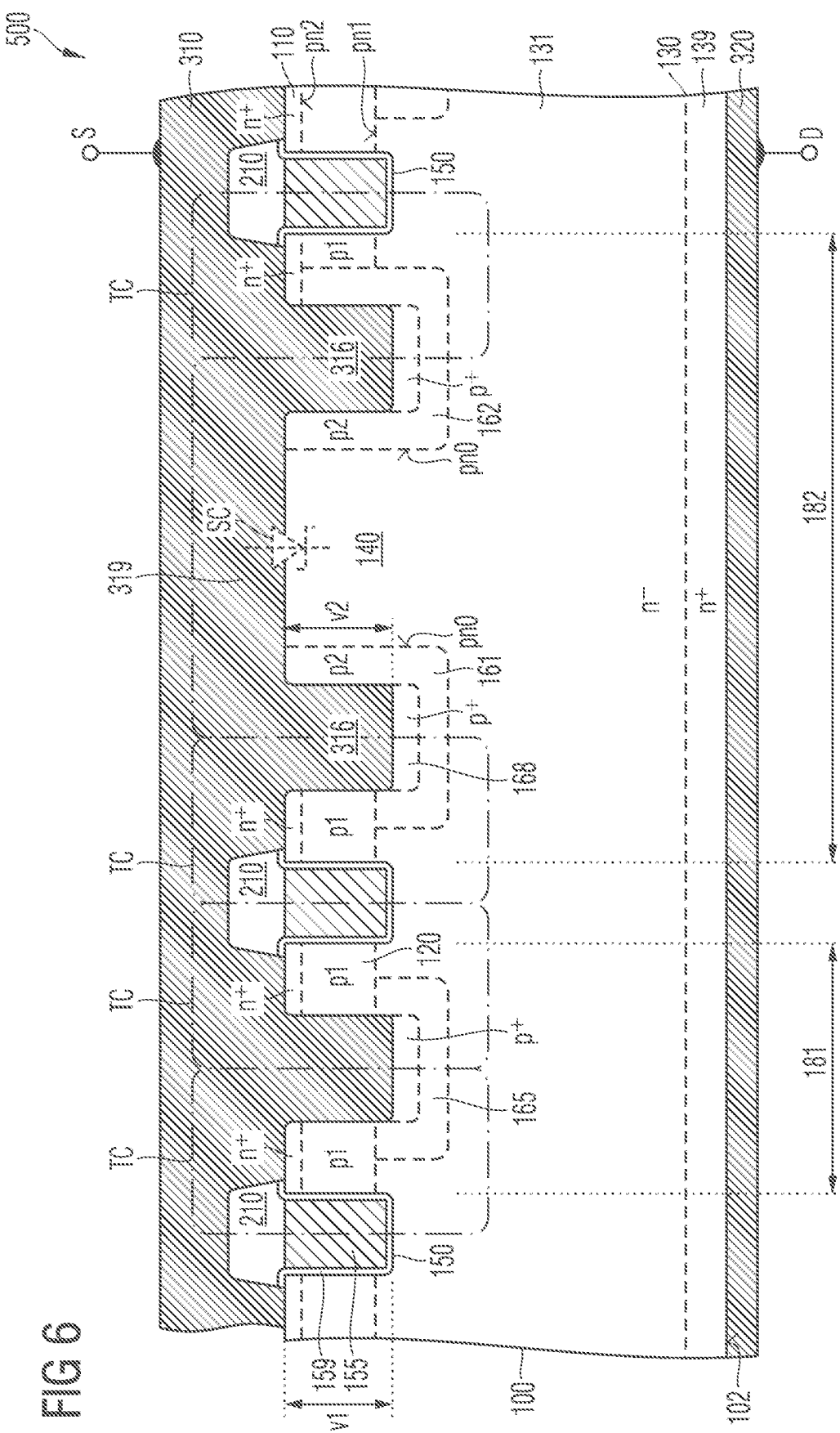
FIG. 6 shows a vertical cross section through an SiC semiconductor component in one embodiment with transistor cells with channels on both sides and deep contact structures.

According to FIG. 6, first and second side walls 151, 152 of the gate structures 150 may run vertically to the first surface 101. In first mesas 181, two transistor cells TC are formed in each case, and trench contacts 316 extend from the first load electrode 310 into the first and second mesas 181, 182.

The gate structures 150, the trench contacts 316 and the first and second mesas 181, 182 may be stripe structures. Alternatively, the gate structures 150 and/or the trench contacts 316 may each form a grid. Alternatively, the first and second mesas 181, 182 may be sections of a mesa in the form of a grid.

A vertical extent v2 of the trench contacts 316 may correspond roughly to the vertical extent v1 of the gate structures 150 in the SiC semiconductor body 100.

The first, second and any further shielding areas 161, 162, 165 present may have, below the trench contacts 316, highly doped shielding contact areas 168 which may be formed between the trench contact 316 and a main section of the respective shielding area 161, 162, 165. A lateral extent of the first, second and any further shielding areas 161, 162, 165 present may be greater than a corresponding lateral extent of the trench contacts 316. The shielding areas 161, 162, 165 may extend along the side walls of the trench contacts 316 as far as the source areas 110, and they remain spaced apart from the adjacent gate structures 150 by the body areas 120.

In the second mesas 182, two trench contacts 316 in each case may be formed either side of a diode area 140 in between, in which case the first and second shielding areas 161, 162 may extend along the trench contacts 316 as far as the first surface 101 and form vertical pn junctions pn0 with the diode area 140.

Figure 7:
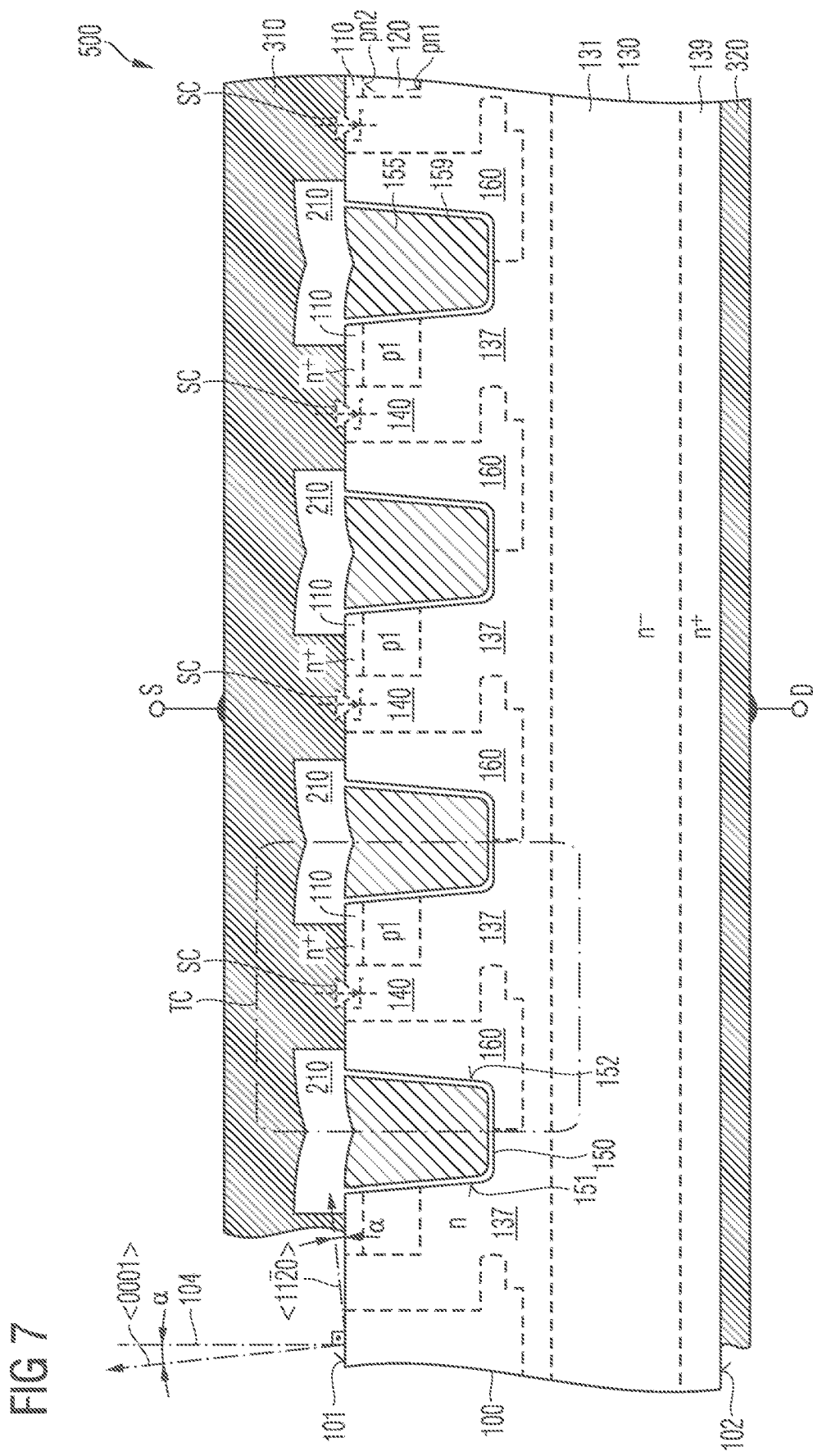
FIG. 7 shows a vertical cross section through an SiC semiconductor component in one embodiment with a diode area between a shielding area and a body area.

In the embodiment of FIG. 7, diode areas 140 extend in each case between a shielding area 160 and a body area 120 from the first surface 101 as far as a current distribution area 137.

Figure 8A:
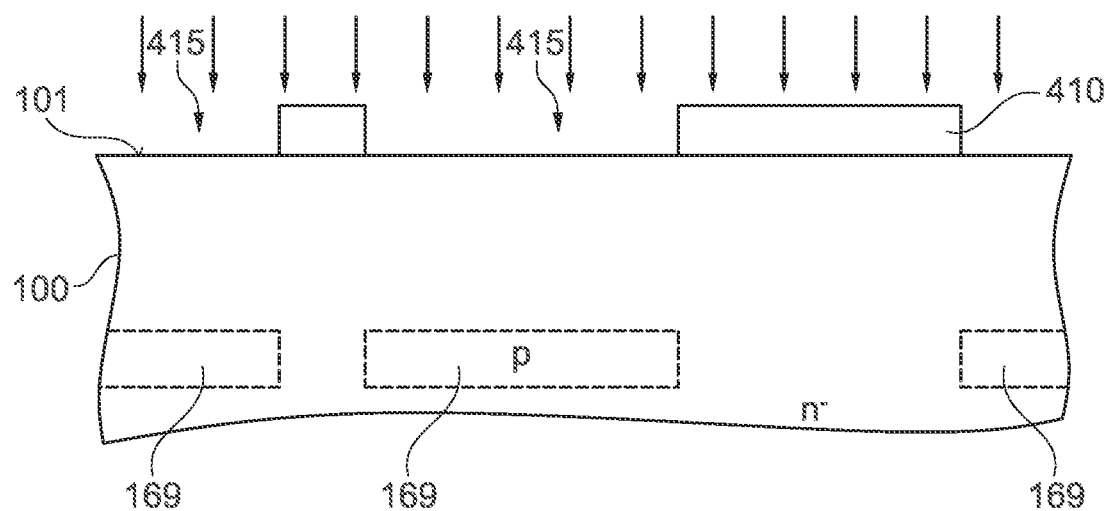
FIGS. 8A to 8C show vertical cross sections through a silicon carbide substrate to represent a process for producing an SiC semiconductor component with a diode area that widens in the downward direction for a Schottky contact in one embodiment.
Figure 8B:
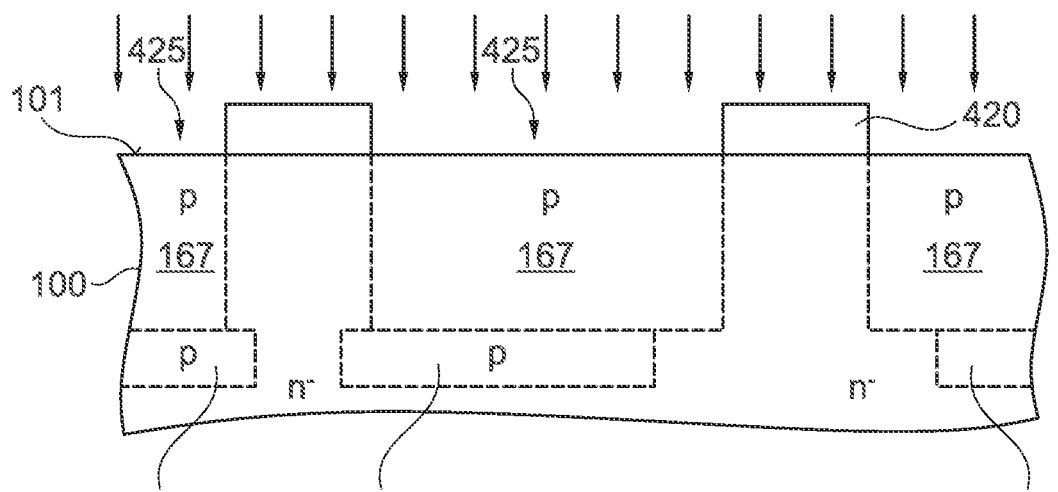
Figure 8C:
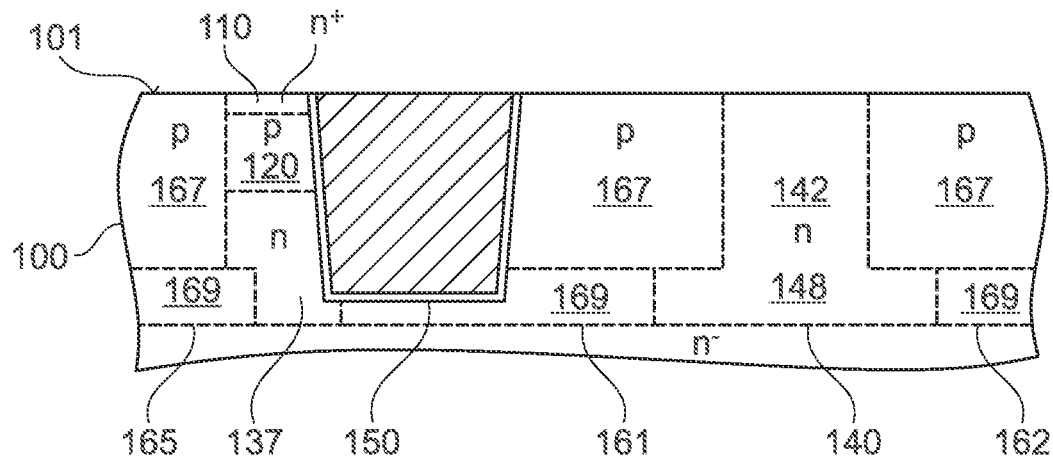

FIGS. 8A-8C show a process for producing the semiconductor component 500 according to FIG. 4E. In this case, the SiC semiconductor body 100 of the semiconductor component 500 of FIG. 4E forms part of a silicon carbide substrate, for example of an SiC wafer or an epitaxial layer, and a first surface 101 of the SiC semiconductor body 100 corresponds to a main surface on the front side of the silicon carbide substrate.

A first mask material is deposited onto the first surface 101 of the SiC semiconductor body 100 and structured by a photolithography method, wherein a first implantation mask 410 with first openings 415 originates from the first mask layer. Acceptor atoms are implanted with high implantation energy through the openings 415 in the first implantation mask 410.

FIG. 8A shows the first implantation mask 410 and subareas 169 formed by the implanted acceptor atoms, which are formed below the first mask openings 415 and at a distance from the first surface 101.

The first implantation mask 410 is removed. A second mask layer is deposited and structured by a photolithography method. A second implantation mask 420 originates from the second mask layer. Further acceptor atoms are implanted through the openings 425 in the second implantation mask 420, where the maximum implantation energy here is less than the minimum implantation energy on formation of the subareas 169.

FIG. 8B shows the second implantation mask 420 and main areas 167 formed by the implanted acceptor atoms, which are formed beneath the second openings 425 between the first surface 101 and the subareas 169. Further implantations into the regions of the SiC semiconductor body 100 between the main areas 167 form source areas 110, body areas 120, current distribution areas 137 and diode areas 140. The further implantations may be executed before or after formation of the subareas 169 and/or the main areas 167. Gate trenches are formed, with formation of source areas 110, body areas 120 and current distribution areas 137 on first side walls of the gate trenches and with formation of main areas 167 and subareas 169 on second side walls opposite the first side walls.

FIG. 8C shows a section of an SiC semiconductor component 500 with a diode area 140 and with first, second and further shielding areas 161, 162, 165 as described above in FIG. 4E.

Figure 9A:
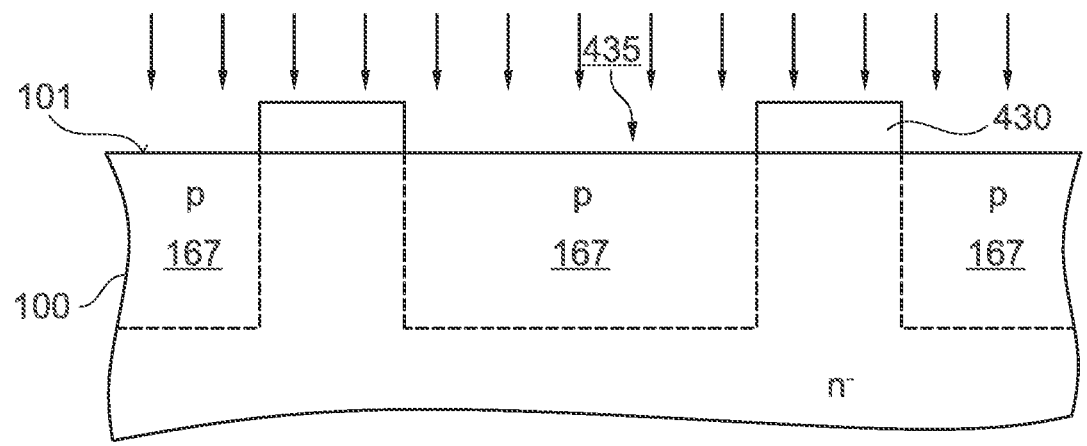
FIGS. 9A to 9C show vertical cross sections through a silicon carbide substrate with a diode area that widens in the downward direction for a Schottky contact to represent a process for producing an SiC semiconductor component in a further embodiment.
Figure 9B:
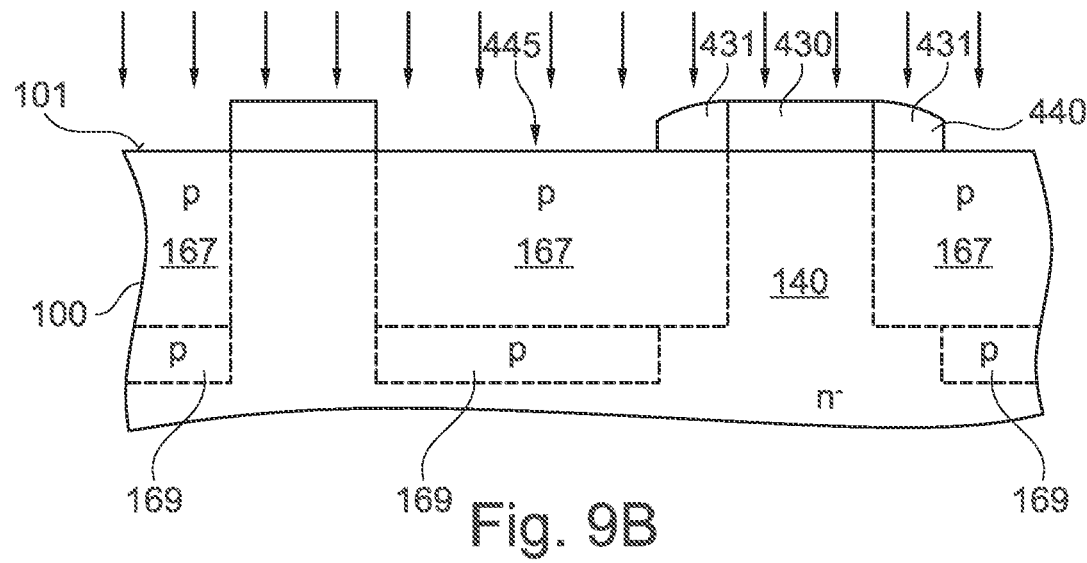
Figure 9C:
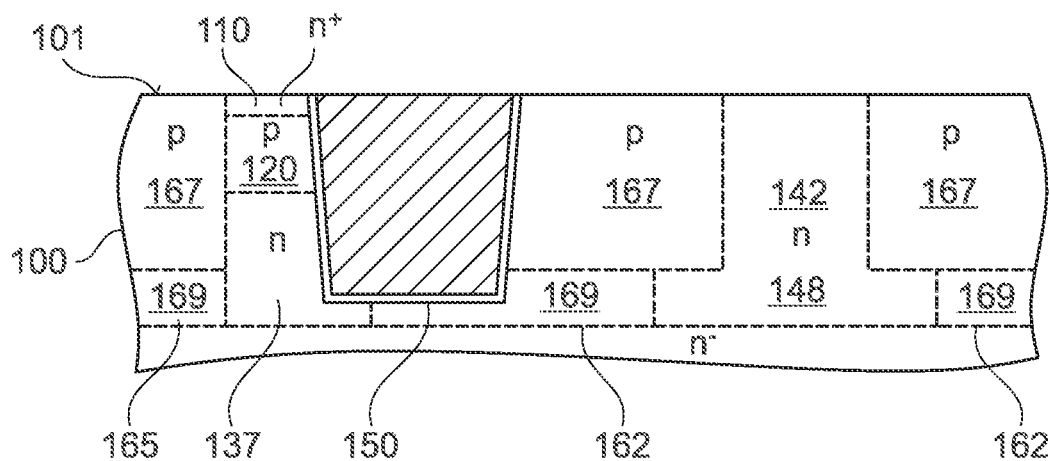

FIGS. 9A-9C show a process in which the implantation mask for formation of the subareas 169 originates from the implantation mask for formation of the main areas 167.

FIG. 9A shows a third implantation mask 430 on the first surface 101. Acceptor atoms are implanted into the SiC semiconductor body 100 through openings 435 in the third implantation mask 430.

FIG. 9A shows main areas 167 formed by the implanted acceptor atoms of first, second and further shielding areas. As a result of the formation of spacers 431 selectively in sections of the third implantation mask 430 above diode areas 140, a fourth implantation mask 440 is formed. Acceptor atoms are implanted with an implantation energy higher than the maximum implantation energy for formation of the main areas 167 through the openings 445 in the fourth implantation mask 440.

FIG. 9B shows subareas 169 formed by the implanted acceptor atoms with a smaller lateral width in some cases than the main areas 167.

FIG. 9C shows the SiC semiconductor body 100 after formation of gate structures 150, source areas 110, body areas 120 and current distribution areas 137.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
   gate structures extending from a first surface of an SiC semiconductor body into the SiC semiconductor body;
   a drift zone of a first conductivity type formed in the SiC semiconductor body;
   first mesas and second mesas arranged between the gate structures in the SiC semiconductor body;
   body areas of a second conductivity type arranged in the first mesas and the second mesas, the body areas each adjoining a first side wall of one of the gate structures;
   first shielding areas of the second conductivity type adjoining a second side wall of one of the gate structures;
   second shielding areas of the second conductivity type adjoining the body areas in the second mesas; and
   diode areas of the first conductivity type of the drift zone, the diode areas forming Schottky contacts with a load electrode between the first shielding areas and the second shielding areas.

2. The semiconductor component of claim 1, wherein the first side wall of the gate structures run parallel to (11-20) lattice planes in the SiC semiconductor body or are tilted by not more than 2° relative to the (11-20) lattice planes.

3. The semiconductor component of claim 1, wherein at least three first mesas are formed between every two adjacent second mesas.

4. The semiconductor component of claim 1, wherein an average dopant concentration in the diode areas is higher than an average dopant concentration in the drift zone.

5. The semiconductor component of claim 1, further comprising:
   auxiliary trench structures extending between the diode area and the second shielding areas from the first surface into the second mesas.

6. A semiconductor component, comprising:
   a gate structure extending from a first surface of a SiC semiconductor body and into the SiC semiconductor body;
   a body area in the SiC semiconductor body and adjoining a first side wall of the gate structure;
   a first shielding area and a second shielding area of a conductivity type of the body area, the first shielding area and the second shielding area being at least twice as highly doped as the body area, the first shielding area and the second shielding area being in the SiC semiconductor body; and
   a diode area in the SiC semiconductor body, the diode area forming a Schottky contact with a load electrode between the first shielding area and the second shielding area.

7. The semiconductor component of claim 6, wherein the diode area forms a pn junction with the first shielding area and with the second shielding area.

8. The semiconductor component of claim 6, wherein a separation of a lower edge of the first shielding area and/or the second shielding area from the first surface is greater than a vertical extent of the gate structure.

9. The semiconductor component of claim 6, further comprising:
   a source area between the first surface and the body area, the source area adjoining at least the first side wall of the gate structure.

10. The semiconductor component of claim 9, wherein the first shielding area adjoins the body area on an opposite side from the diode area, and wherein the second shielding area adjoins a further body area.

11. The semiconductor component of claim 10, wherein the first shielding area and the second shielding area each adjoin a contact structure on an opposite side from the diode area, and wherein the contact structure extends from the first surface into the SiC semiconductor body.

12. The semiconductor component of claim 9, wherein the first shielding area adjoins a second side wall of the gate structure, and wherein the second shielding area adjoins a further body area.

13. The semiconductor component of claim 12, wherein a dopant concentration has a local maximum in the first shielding area, and wherein the local maximum is between the gate structure and a second surface of the SiC semiconductor body opposite the first surface.

14. The semiconductor component of claim 12, wherein the first side wall runs parallel to a first main lattice plane and/or is tilted by at most 2° relative to the first main lattice plane in the SiC semiconductor body.

15. The semiconductor component of claim 12, wherein the semiconductor component comprises a plurality of gate structures, wherein the SiC semiconductor body comprises a first mesa between two adjacent gate structures, the first mesa being free of a diode area, wherein the SiC semiconductor body comprises a second mesa between two adjacent gate structures, wherein a diode area is formed in the second mesa, wherein the first shielding area adjoins the diode area, and wherein the second shielding area adjoins the diode area and a body area.

16. The semiconductor component of claim 15, wherein the semiconductor component comprises a plurality of first mesas and second mesas, wherein adjacent gate structures between which the first mesas are formed are formed in a first middle-to-middle separation from one another, wherein adjacent gate structures between which the second mesas are formed are formed in a second middle-to-middle separation from one another, and wherein the first middle-to-middle separation is at least 40% and at most 60% of the second middle-to-middle separation.

17. The semiconductor component of claim 15, wherein at least three first mesas are formed between two adjacent second mesas.

18. The semiconductor component of claim 6, wherein the load electrode comprises a main layer and, between the main layer and the first surface, a first sublayer, and wherein at least a section of the first sublayer adjoins the diode area.

19. The semiconductor component of claim 18, wherein the load electrode comprises a second sublayer adjoining at least the source area and/or at least one of the first shielding area and the second shielding area.

20. The semiconductor component of claim 6, wherein the load electrode comprises a Schottky contact structure extending in vertical direction through openings in an interlayer dielectric that separates the gate structures from the load electrode toward the diode area.

21. The semiconductor component of claim 20, wherein the Schottky contact structure directly adjoins the diode area, the first shielding area and the second shielding area.

22. The semiconductor component of claim 6, wherein the diode area comprises a lower subarea and, between the lower subarea and the first surface, an upper subarea, and wherein a second average width of the lower subarea is at least 120% of a first average width of the upper subarea.

23. The semiconductor component of claim 6, wherein the diode area comprises SiC.

* * * * *